United States Patent
Sun et al.

(10) Patent No.: US 11,837,147 B2
(45) Date of Patent: Dec. 5, 2023

(54) DISPLAY SUBSTRATE, DISPLAY PANEL, DISPLAY APPARATUS AND DISPLAY DRIVING METHOD

(71) Applicant: BOE TECHNOLOGY GROUP CO., LTD., Beijing (CN)

(72) Inventors: Jian Sun, Beijing (CN); Zhen Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/763,719

(22) PCT Filed: May 21, 2021

(86) PCT No.: PCT/CN2021/095109
§ 371 (c)(1),
(2) Date: Mar. 25, 2022

(87) PCT Pub. No.: WO2021/238787
PCT Pub. Date: Dec. 2, 2021

(65) Prior Publication Data
US 2022/0327987 A1 Oct. 13, 2022

(30) Foreign Application Priority Data
May 27, 2020 (CN) .......................... 202010461664.3

(51) Int. Cl.
*G09G 3/20* (2006.01)
*G11C 19/28* (2006.01)

(52) U.S. Cl.
CPC ......... *G09G 3/2092* (2013.01); *G09G 3/2003* (2013.01); *G09G 2300/0452* (2013.01);
(Continued)

(58) Field of Classification Search
CPC ............... G09G 3/2092; G09G 3/2003; G09G 2300/0452; G09G 2310/027;
(Continued)

(56) References Cited

U.S. PATENT DOCUMENTS 8,922,603 B2 * 12/2014 Yonemaru ............ G09G 3/3648
345/55
9,852,706 B2 * 12/2017 Wang ................... G09G 3/3648
(Continued)

FOREIGN PATENT DOCUMENTS

CN     101329484 A    12/2008
CN     102956213 A     3/2013
(Continued)

OTHER PUBLICATIONS

China Patent Office, CN202010461664.3 First Office Action dated Sep. 2, 2021.
(Continued)

*Primary Examiner* — Jose R Soto Lopez
(74) *Attorney, Agent, or Firm* — HOUTTEMAN LAW LLC

(57) ABSTRACT

A display substrate, a display panel, a display apparatus, and a display driving method are provided. The display substrate includes: a display region and a peripheral region at a periphery thereof. Gate lines, data lines and a pixel array are in the display region. The pixel array includes pixel units each coupled to a corresponding gate line and data line, and color mixing pixel columns each including multiple pixel units emitting light of different colors and including periodic structures along the column direction. The number of pixel units in each periodic structure is constant. A gate driving circuit is in the peripheral region and includes cascaded shift registers each having a cascading signal output terminal and scanning signal output terminals each coupled to a corre-
(Continued)

sponding gate line. The number of scanning signal output terminals of each shift register is equal to the number of pixel units in each periodic structure.

20 Claims, 8 Drawing Sheets

(52) U.S. Cl.
CPC ............. *G09G 2310/027* (2013.01); *G09G 2310/0281* (2013.01); *G09G 2310/0286* (2013.01); *G09G 2310/08* (2013.01); *G09G 2330/021* (2013.01); *G11C 19/28* (2013.01)

(58) Field of Classification Search
CPC ... G09G 2310/0281; G09G 2310/0286; G09G 2310/08; G09G 2330/021; G09G 3/3607; G09G 2230/00; G09G 2310/0267; G09G 3/3677; G09G 3/3266; G09G 3/20; G09G 3/32; G09G 3/3674; G11C 19/28; G09F 9/30

See application file for complete search history.

(56) References Cited

U.S. PATENT DOCUMENTS

| | | | | |
|---|---|---|---|---|
| 10,997,891 B1* | 5/2021 | Zhang | ............... | G09G 3/30 |
| 11,367,394 B2* | 6/2022 | Yamanaka | ........... | G09G 3/3233 |
| 2012/0280896 A1* | 11/2012 | Yamashita | ........... | G09G 3/3614 |
| | | | | 345/88 |
| 2013/0293515 A1* | 11/2013 | Fujioka | ............... | G06F 3/0446 |
| | | | | 345/87 |
| 2015/0138464 A1* | 5/2015 | Okazaki | ............. | G02F 1/13306 |
| | | | | 349/37 |
| 2015/0220294 A1* | 8/2015 | Zheng | ............... | G09G 3/3208 |
| | | | | 345/83 |
| 2015/0371605 A1* | 12/2015 | Wu | ............... | G09G 5/02 |
| | | | | 345/604 |
| 2017/0076692 A1* | 3/2017 | Miura | ............... | G09G 3/3607 |
| 2017/0301304 A1* | 10/2017 | Gao | ............... | G09G 3/3677 |
| 2018/0308410 A1* | 10/2018 | Chen | ............... | G09G 3/2003 |
| 2019/0035318 A1* | 1/2019 | Xing | ............... | G09G 3/2003 |
| 2019/0172407 A1* | 6/2019 | Chen | ............... | G09G 3/3611 |
| 2020/0051486 A1* | 2/2020 | Chang | ............... | G09G 3/2085 |
| 2021/0350733 A1* | 11/2021 | Liu | ............... | G09G 3/3266 |
| 2021/0398469 A1* | 12/2021 | Tsai | ............... | G09G 3/20 |
| 2022/0309981 A1* | 9/2022 | Li | ............... | G09G 3/2003 |
| 2022/0335894 A1* | 10/2022 | Zhou | ............... | G09G 3/3266 |
| 2022/0351663 A1* | 11/2022 | Dai | ............... | G09G 3/2003 |

FOREIGN PATENT DOCUMENTS

| | | |
|---|---|---|
| CN | 104021769 A | 9/2014 |
| CN | 110456585 A | 11/2019 |
| CN | 111477159 A | 7/2020 |
| JP | H 10228263 A | 8/1998 |

OTHER PUBLICATIONS

China Patent Office, CN202010461664.3 Second Office Action dated May 6, 2022.

* cited by examiner

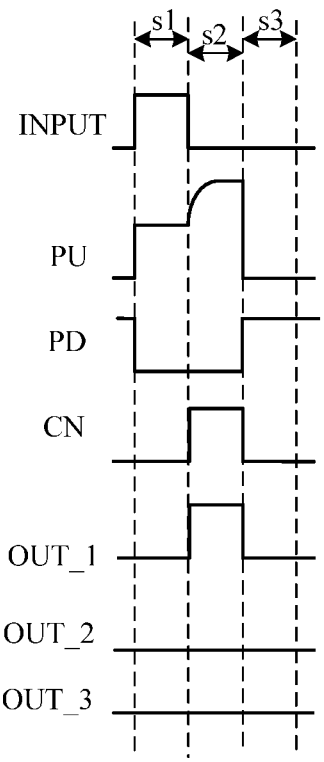

FIG. 12

In an $i^{th}$ driving stage in one frame time, cascading signal output terminals of shift registers in respective stages in the gate driving circuit sequentially output cascading signals; for any one of the shift registers, during it outputs the cascading signal, an $i^{th}$ scanning signal output terminal of the shift register outputs a scanning signal, $1 \leqslant i \leqslant N$, and i is an integer ——S1301

A data voltage loaded in each data line in any driving stage is kept unchanged ——S1302

FIG. 13

DISPLAY SUBSTRATE, DISPLAY PANEL, DISPLAY APPARATUS AND DISPLAY DRIVING METHOD

CROSS REFERENCE TO RELATED APPLICATIONS

The present application claims the priority of the Chinese Patent Application No. 202010461664.3 filed on May 27, 2020, the content of which is incorporated herein by reference in its entirety.

TECHNICAL FIELD

The present disclosure relates to the field of display technology, and in particular to a display substrate, a display panel, a display apparatus, and a display driving method.

BACKGROUND

In the Gate driver On Array (GOA) technology, gate driver integrated circuits (ICs) are directly formed on an array substrate. In this way, the gate driver ICs can be formed simultaneously with the existing array process, thereby effectively reducing the production cost and cycle.

Each gate driver IC includes a plurality of cascaded shift registers, the shift register at each stage has one signal output terminal, and corresponds to a gate line of one row; the signal output terminal of the shift register at the stage is coupled to the gate line of the corresponding row and a signal input terminal of the shift register at a next stage, and provides a signal used as a cascading signal and a scanning signal. In the related art, a display is generally driven in a progressive (line by line) scanning manner. That is, signal output terminals of respective stages of the shift registers sequentially output scanning signals to gate lines of corresponding rows for driving in the progressive scanning manner.

SUMMARY

The present disclosure provides a display substrate, a display panel, a display apparatus and a display driving method.

The display substrate provided by the embodiment of the present disclosure includes: a display substrate, including: a display region and a peripheral region at a periphery of the display region, wherein a plurality of gate lines extending in a row direction, a plurality of data lines extending in a column direction and a pixel array are arranged in the display region, the pixel array is in a pixel region defined by the plurality of gate lines and the plurality of data lines; the pixel array includes a plurality of pixel units, each of which is coupled to a corresponding one of the plurality of gate lines and a corresponding one of the plurality of data lines;
  the pixel array includes a plurality of color mixing pixel columns, each of which includes multiple ones, emitting light of different colors, of the plurality of pixel units and arranged in periodic structures along the column direction; each of the periodic structures includes pixel units of at least two different colors; and
  the number of the pixel units in each of the periodic structures in each of the plurality of color mixing pixel columns is constant; and
a gate driving circuit is arranged in the peripheral region and includes a plurality of cascaded shift registers, each of which is provided with one cascading signal output terminal and a plurality of scanning signal output terminals; each of which is coupled to a corresponding one of the plurality of gate lines; the cascading signal output terminal of the shift register in a stage other than a last stage is coupled to a signal input terminal of the shift register in a next stage adjacent to the stage; and the number of the scanning signal output terminals of each of the plurality of shift registers is equal to the number of the pixel units in each periodic structure in each color mixing pixel column.

In some embodiments, in the pixel array, types and arrangements of the pixel units in each periodic structure in each of the plurality of color mixing pixel columns are identical; or
  the pixel units in each of the periodic structures in different color mixing pixel columns have same types but have different arrangements; or
  the pixel units in each of the periodic structures in different color mixing pixel columns have different types and different arrangements.

In some embodiments, in the pixel array, the plurality of color mixing pixel columns include a plurality of color mixing pixel columns identical to each other; and
  a periodic structure of each color mixing pixel column includes a red pixel unit, a green pixel unit, and a blue pixel unit.

In some embodiments, in the pixel array, the plurality of color mixing pixel columns include a plurality of first color mixing pixel columns and a plurality of second color mixing pixel columns; and
  the plurality of first color mixing pixel columns and the plurality of second color mixing pixel columns are alternately arranged along the row direction.

In some embodiments, each first color mixing pixel column includes a plurality of first periodic structures as periodic structures, and each second color mixing pixel column includes a plurality of second periodic structures as periodic structures;
  each first periodic structure includes a first periodic sub-structure and a second periodic sub-structure, and each second periodic structure includes a first periodic sub-structure and a second periodic sub-structure; and
  each first color mixing pixel column includes a plurality of first periodic sub-structures and a plurality of second periodic sub-structures alternately arranged in the column direction, and each second color mixing pixel column includes a plurality of second periodic sub-structures and a plurality of first periodic sub-structures alternately arranged in the column direction.

In some embodiments, each first periodic sub-structure includes a red pixel unit and a green pixel unit arranged along the column direction, and each second periodic sub-structure includes a blue pixel unit and a white pixel unit arranged along the column direction, or
  each first periodic sub-structure includes a red pixel unit, a green pixel unit, and a white pixel unit arranged along the column direction, and each second periodic sub-structure includes a red pixel unit, a green pixel unit, and a blue pixel unit arranged along the column direction.

In some embodiments, in the pixel array, the plurality of color mixing pixel columns include a plurality of first color mixing pixel columns, a plurality of second color mixing pixel columns, a plurality of third color mixing pixel columns, and a plurality of fourth color mixing pixel columns; and one first color mixing pixel column, one second color mixing pixel column, one third color mixing pixel column, and one fourth color mixing pixel column are arranged in sequence along the row direction to form one color mixing pixel column period; the plurality of first color mixing pixel columns, the plurality of second color mixing pixel columns, the plurality of third color mixing pixel columns, and the plurality of fourth color mixing pixel columns form a plurality of color mixing pixel column periods arranged in sequence along the row direction.

In some embodiments, the first color mixing pixel column includes a plurality of first periodic structures as periodic structures, each of which includes a red pixel unit and a blue pixel unit arranged in the column direction;

the second color mixing pixel column includes a plurality of second periodic structures as periodic structures, each of which includes a green pixel unit and a white pixel unit arranged in the column direction;

the third color mixing pixel column includes a plurality of third periodic structures as periodic structures, each of which includes a blue pixel unit and a red pixel unit arranged in the column direction; and the fourth color mixing pixel column includes a plurality of fourth periodic structures as periodic structures, each of which includes a white pixel unit and a green pixel unit arranged in the column direction.

In some embodiments, the pixel array further includes a plurality of monochrome pixel columns each including pixel units emitting light of the same color.

In some embodiments, the plurality of monochrome pixel columns and the plurality of color mixing pixel columns are alternately arranged in the row direction.

In some embodiments, the plurality of monochrome pixel columns include a plurality of first monochrome pixel columns and a plurality of second monochrome pixel columns;

the plurality of color mixing pixel columns include a plurality of first color mixing pixel columns and a plurality of second color mixing pixel columns alternately arranged along the row direction; and a first monochrome pixel column and a second monochrome pixel column are arranged between every adjacent first and second color mixing pixel columns.

In some embodiments, each first monochrome pixel column includes a plurality of red pixel units arranged in the column direction, each second monochrome pixel column includes a plurality of green pixel units arranged in the column direction, each periodic structure of each first color mixing pixel column includes a blue pixel unit and a white pixel unit arranged along the column direction; and each periodic structure of each second color mixing pixel column includes a white pixel unit and a blue pixel unit arranged in the column direction.

In some embodiments, each shift register includes: a pre-charging reset circuit, a voltage control circuit, a cascading output circuit and a plurality of scanning output circuits, wherein the plurality of scanning output circuits correspond to the plurality of scanning signal output terminals one by one; the pre-charging reset circuit, the voltage control circuit, the cascading output circuit and the plurality of scanning output circuits are coupled to a first node; and the voltage control circuit, the cascading output circuit and the plurality of scanning output circuits are coupled to a second node;

the pre-charging reset circuit is coupled to the signal input terminal, a reset signal terminal, a first power supply terminal, and a second power supply terminal, and is configured to write a first operating voltage provided by the first power supply terminal to the first node in response to a control of a signal provided by the signal input terminal, and write a second operating voltage provided by the second power supply terminal to the first node in response to a control of a signal provided by the reset signal terminal;

the voltage control circuit is coupled to a third power supply terminal and a second clock signal terminal, and is configured to write a third operating voltage provided by the third power supply terminal to the second node in response to a control of a voltage at the first node, or to write a second clock signal provided by the second clock signal terminal to the second node in response to a control of the second clock signal;

the cascading output circuit is coupled to a first clock signal terminal, the third power supply terminal, and the cascading signal output terminal, and is configured to write a first clock signal provided by the first clock signal terminal to the cascading signal output terminal in response to a control of a voltage at the first node, and write the third operating voltage to the cascading signal output terminal in response to a control of a voltage at the second node; and each of the plurality of scanning output circuits is coupled to a corresponding scanning clock signal terminal, the third power supply terminal, and a corresponding scanning signal output terminal, and is configured to write a scanning clock signal provided by the corresponding scanning clock signal terminal to the corresponding scanning signal output terminal, respectively, in response to a control of the voltage at the first node, and to write the third operating voltage to the corresponding scanning signal output terminal in response to a control of the voltage at the second node.

In some embodiments, the pre-charging reset circuit includes: a first transistor and a second transistor, the voltage control circuit includes: a third transistor and a fourth transistor, the cascading output circuit includes: a fifth transistor, a sixth transistor, a first capacitor and a second capacitor, and each scanning output circuit includes: a seventh transistor and an eighth transistor;

a control electrode of the first transistor is coupled to the signal input terminal, a first electrode of the first transistor is coupled to the first power supply terminal, and a second electrode of the first transistor is coupled to the first node; and a control electrode of the second transistor is coupled to the reset signal terminal, a first electrode of the second transistor is coupled to the first node, and a second electrode of the second transistor is coupled to the second power supply terminal;

a control electrode and a first electrode of the third transistor are coupled to the second clock signal terminal, and a second electrode of the third transistor is coupled to the second node;

a control electrode of the fourth transistor is coupled to the first node, a first electrode of the fourth transistor is coupled to the second node, and a second electrode of the fourth transistor is coupled to the third power supply terminal;

a control electrode of the fifth transistor is coupled to the first node, a first electrode of the fifth transistor is coupled to the first clock signal terminal, and a second electrode of the fifth transistor is coupled to the cascading signal output terminal;

a control electrode of the sixth transistor is coupled to the second node, a first electrode of the sixth transistor is coupled to the cascading signal output terminal, and a second electrode of the sixth transistor is coupled to the third power supply terminal;

a first terminal of the first capacitor is coupled to the first node, and a second terminal of the first capacitor is coupled to the cascading signal output terminal;

a first terminal of the second capacitor is coupled to the second node, and a second terminal of the second capacitor is coupled to the third power supply terminal;

a control electrode of the seventh transistor is coupled to the first node, a first electrode of the seventh transistor is coupled to a corresponding scanning clock signal output terminal, and a second electrode of the seventh transistor is coupled to a corresponding scanning signal output terminal; and a control electrode of the eighth transistor is coupled to the second node, a first electrode of the eighth transistor is coupled to a corresponding scanning clock signal output terminal, and a second electrode of the eighth transistor is coupled to the third power supply terminal.

In some embodiments, each shift register further includes: a noise reduction circuit coupled to the first node, the second node, and the third power supply terminal, and configured to write the third operating voltage to the first node in response to a control of a voltage at the second node;

the noise reduction circuit includes: a ninth transistor having a control electrode coupled to the second node, a first electrode coupled to the first node, and a second electrode coupled to the third power supply terminal;

each shift register further includes: an anticreep circuit between the pre-charging reset circuit and the pull-up node, and configured to prevent a voltage at the pull-up node from being discharged through the pre-charging reset circuit; and the anticreep circuit includes: a tenth transistor having a control electrode coupled to a fourth power supply electrode, a first electrode coupled to the first node, and a second electrode coupled to the pre-charging reset circuit.

An embodiment of the present disclosure further provides a display panel, which includes: the display substrate in the above embodiments.

An embodiment of the present disclosure further provides a display apparatus, which includes: the display panel in the above embodiment.

An embodiment of the present disclosure also provides a display driving method for driving the above display substrate, wherein each shift register includes N scanning signal output terminals, N is an integer greater than or equal to 2, and one frame time is divided into N driving stages, the display driving method includes:

in an $i^{th}$ driving stage in one frame time, cascading signal output terminals of shift registers in respective stages in the gate driving circuit sequentially output cascading signals; during any one of the shift registers outputs the cascading signal, an $i^{th}$ scanning signal output terminal of the shift register outputs a scanning signal, $1 \leq i \leq N$, and i is an integer.

In some embodiments, a data voltage loaded in each data line in any one driving stage is kept unchanged.

BRIEF DESCRIPTION OF DRAWINGS

FIG. 12 is a timing diagram illustrating an operation of the shift register shown in FIG. 11; and FIG. 13 is a flowchart illustrating a display driving method according to an embodiment of the present disclosure.

DETAIL DESCRIPTION OF EMBODIMENTS

In order to enable one of ordinary skill in the art to better understand the technical solutions of the present disclosure, a display substrate, a display panel, a display apparatus, and a display driving method provided in the present disclosure are described in detail below with reference to the accompanying drawings.

In the related art, the shift register at each stage in the gate driver IC (gate driving circuit) corresponds to a gate line of one row; the signal output terminal of the shift register at the stage is coupled to a gate line of a corresponding row. The display is driven in a row-by-row scanning manner, which is thus also called "driven in a progressive scanning manner". That is, signal output terminals of respective stages of the shift registers sequentially output scanning signals to gate lines of corresponding rows for driving in a scanning manner.

It is found in practical applications that if pixel units emitting light of different colors (i.e., sub-pixels emitting light of different colors, such as a red sub-pixel emitting red light, a green sub-pixel emitting green light, or a blue sub-pixel emitting blue light) are located in the same column in a display region of a display apparatus, when a monochrome picture is displayed with a technical solution in the related art, a data voltage loaded in a data line needs to be changed frequently (theoretically, the data voltage loaded in the data line changes once in each row driving period), which results in higher overall power consumption of the display apparatus. In addition, frequent changes of the data voltage in the data line also cause coupling interference to signals in adjacent data lines, so that an obvious Mura may exist in the monochrome picture.

In order to solve at least one technical problem in the related art, embodiments of the present disclosure provide a display substrate, a display panel, a display apparatus, and a display driving method.

Figure 1:
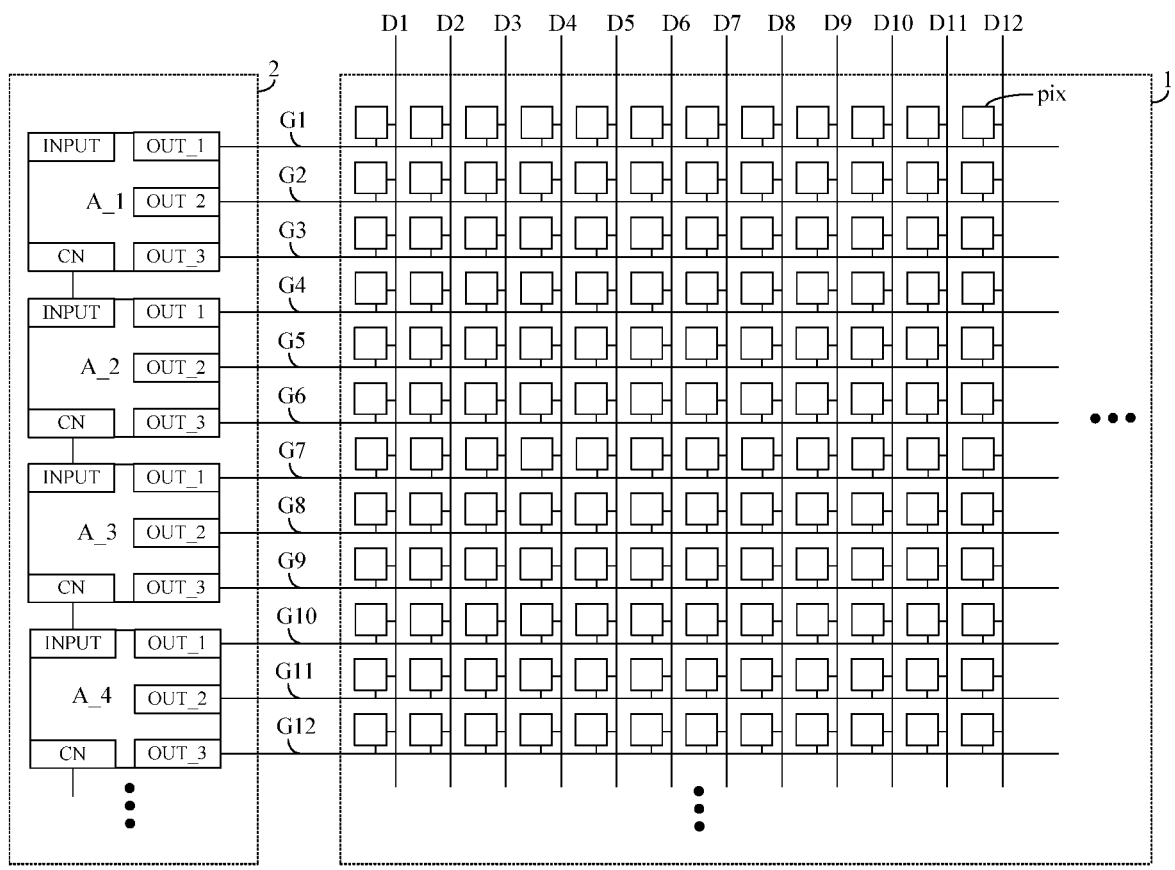
FIG. 1 is a schematic diagram of a structure of a display substrate according to an embodiment of the present disclosure.

FIG. 1 is a schematic diagram of a structure of a display substrate according to an embodiment of the present disclosure. As shown in FIG. 1, the display substrate includes: a display region and a peripheral region located at a periphery of the display region.

A plurality of gate lines G1 to G12 and a plurality of data lines D1 to D12 are arranged in the display region, define a pixel region in which a pixel array 1 is provided; the pixel array 1 includes a plurality of pixel units pix, each of which is coupled to a corresponding one of gate lines G1 to G12 extending in a row direction and a corresponding one of data lines D1 to D12 extending in a column direction; the pixel array 1 includes a plurality of color mixing pixel columns, each of which includes pixel units emitting light of different colors, which include a plurality of periodic structures sequentially arranged along the column direction, and the number of the pixel units in the periodic structures in the plurality of color mixing pixel columns is constant.

A gate driving circuit 2 is provided in the peripheral region and includes a plurality of cascaded shift registers A_1 to A_4, each of which is provided with one cascading signal output terminal CN and a plurality of scanning signal output terminals OUT_1 to OUT_3; each of the scanning signal output terminals OUT_1 to OUT_3 of the plurality of cascaded shift registers A_1 to A_4 is coupled to a corresponding one of the gate lines G1 to G12; the cascading signal output terminal of the shift register in each stage other than the last stage is coupled to a signal input terminal of the shift register in a next stage adjacent to the stage; and the number of the scanning signal output terminals of the shift register is equal to the number of the pixel units in the periodic structure in the color mixing pixel column.

It should be noted that FIG. 1 only shows a case where 12 gate lines, 12 data lines, and 4 shift registers A_1 to A_4 are provided, and each of the shift registers are provided with 3 scanning signal output terminals OUT_1 to OUT_3, which is only for illustrative purposes.

In the embodiment of the present disclosure, the color mixing pixel column including pixel units emitting light of different colors is provided in the display region; the pixel units in the color mixing pixel column are arranged in the periodic structures along the column direction; each shift register in the peripheral region is provided with the plurality of scanning signal output terminals, each of which is coupled to a corresponding gate line. In this way, the gate lines may be driven by skipping rows based on this configuration; when a monochrome picture is displayed, the pixel units emitting light of a same color may be continuously driven, such that the data voltage loaded in the data line may be kept unchanged for a long time, and therefore, the number of changes of the data voltage loaded in the data line in a unit time (such as a frame time) may be reduced, thereby reducing the power consumption and the coupling interference.

The technical solution of the present disclosure will be described in detail below with reference to the accompanying drawings.

Figure 2:
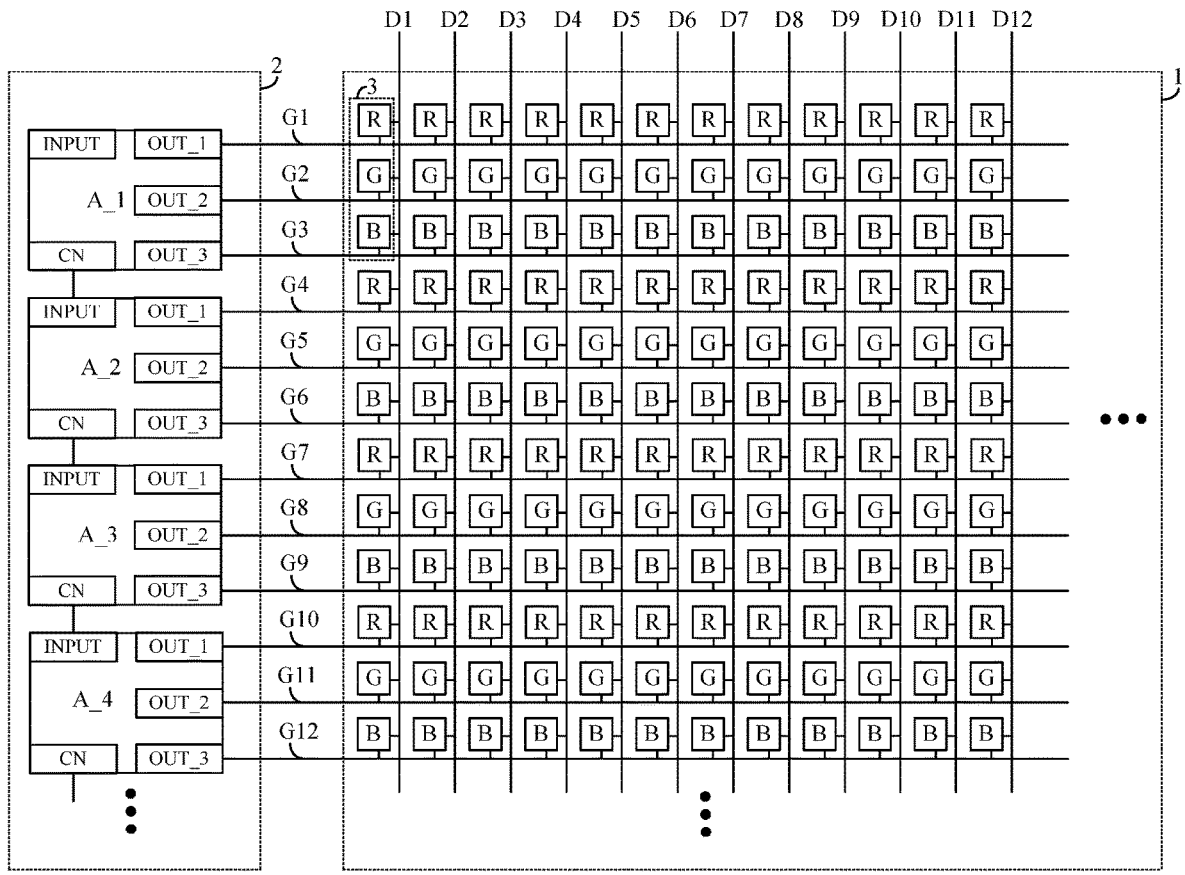
FIG. 2 is a schematic diagram of a structure of a display substrate according to an embodiment of the present disclosure.

FIG. 2 is a schematic diagram of a structure of another display substrate provided in an embodiment of the present disclosure. As shown in FIG. 2, the display substrate shown in FIG. 2 is a special and optional implementation of the display substrate shown in FIG. 1. Specifically, in the pixel array 1, the pixel units contained in the periodic structures in the plurality of color mixing pixel columns have same types and are arranged in a same manner.

In some embodiments, the pixel array 1 includes a plurality of pixel units emitting light of different colors; each pixel column in the pixel array 1 is a color mixing pixel column, and the pixel units included in the periodic structures 3 in the color mixing pixel columns have same types and are configured in the same manner. In this case, the pixel units in the same row in the pixel array 1 emit light of a same color (i.e. are pixel units of a same type).

Illustratively, referring to FIG. 2, the pixel array 1 includes three types of pixel units emitting light of different colors, respectively: a red pixel unit R emitting red light, a green pixel unit G emitting green light, and a blue pixel unit B emitting blue light. In the pixel array 1, all the pixel units in the $(3n-2)^{th}$ pixel row are red pixel units R, all the pixel units in the $(3n-1)^{th}$ pixel row are green pixel units G, all the pixel units in the $(3n)^{th}$ pixel row are green pixel units G, wherein n is a positive integer.

At this time, each pixel column in the pixel array 1 is the color mixing pixel column, and each periodic structure 3 of the color mixing pixel column includes 3 pixel units: one red pixel unit R, one green pixel unit G and one blue pixel unit B, which are arranged in sequence in a column direction. That is, the pixel units included in the periodic structures 3 of the color mixing pixel columns have same types and are configured in the same manner.

Correspondingly, each stage of shift register in the gate driving circuit 2 is provided with N=3 scanning signal output terminals OUT_1 to OUT_3. Illustratively, the first scanning signal output terminals OUT_1 of the shift registers at the $n^{th}$ stages (the $n^{th}$ shift registers) are respectively connected to the $(3n-2)^{th}$ gate lines (the gate lines at the $(3n-2)^{th}$ rows) (such as the gate lines G1, G4, G7, and G10), the second scanning signal output terminals OUT_2 of the shift registers at the $n^{th}$ stages are respectively connected to the $(3n-1)^{th}$ gate lines (such as the gate lines G2, G5, G8, and G11), and the third scanning signal output terminals OUT_3 of the shift registers at the $n^{th}$ stages are respectively connected to the $(3n)^{th}$ gate lines (such as the gate lines G3, G6, G9, and G12).

In a display driving method, one frame time is divided into N=3 driving stages. In the display driving procedure, respective driving stages are performed in sequence, wherein in the $i^{th}$ driving stage, the cascading signal output terminals CN of the respective stages of the shift registers A_1 to A_4 in the gate driving circuit 2 output cascading signals in sequence; and for any one of the shift registers A_1 to A_4, during it outputs the cascading signal, the $i^{th}$ scanning signal output terminal OUT_i of the shift register outputs a scanning signal, $1 \leq i \leq N$, and i is an integer. Each gate line in the display substrate may be driven based on the display driving method.

Figure 3:
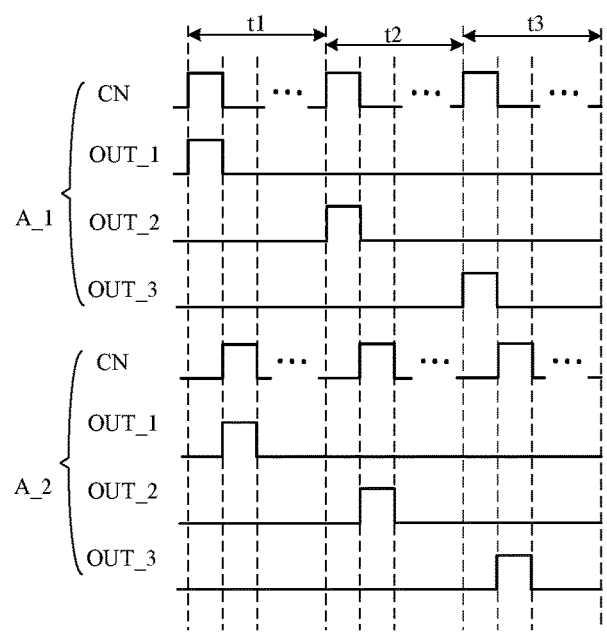
FIG. 3 is a driving timing diagram illustrating that the display substrate of FIG. 2 displays a red color picture.

FIG. 3 is a driving timing diagram illustrating that the display substrate of FIG. 2 displays a red color picture. As shown in FIG. 3, it is assumed that, a display gray scale of each red pixel unit R in the red color picture is L255 and a frame time includes N=3 driving stages.

In a first driving stage t1, the cascading signal output terminals CN of the shift registers A_1 to A_4 sequentially output cascading signals; the first scanning signal output terminals OUT_1 of the shift registers A_1 to A_4 sequentially output scanning signals; the gate lines (such as the gate lines G1, G4, G7, and G10) in the $(3n-2)^{th}$ rows in the display region are sequentially loaded with the scanning signals; the data voltage loaded in each of the data lines D1 to D12 is Vdata_L255 which represents the data voltage corresponding to the gray scale L255. At this time, the red pixel units R in the $(3n-2)^{th}$ rows emit light and have the gray scale of L255.

In a second driving stage t2, the cascading signal output terminals CN of the shift registers A_1 to A_4 sequentially output cascading signals; the second scanning signal output terminals OUT_2 of the shift registers A_1 to A_4 sequentially output scanning signals; the gate lines (such as the gate lines G2, G5, G8, and G11) in the $(3n-1)^{th}$ rows in the display region are sequentially loaded with scanning signals; the data voltage loaded in each of the data lines D1 to D12 is Vdata_L0, which represents the data voltage corresponding to the gray scale L0. At this time, the green pixel units G in the $(3n-1)^{th}$ rows do not emit light, i.e., the gray scale thereof is L0.

In a third driving stage t3, the cascading signal output terminals CN of the shift registers A_1 to A_4 sequentially output cascading signals; the third scanning signal output terminals OUT_3 of the shift registers A_1 to A_4 sequentially output scanning signals; the gate lines (such as the gate lines G3, G6, G9, and G12) in the $(3n)^{th}$ rows in the display region are sequentially loaded with the scanning signals; the data voltage loaded in each of the data lines D1 to D12 is Vdata_L0, which represents the data voltage corresponding to the gray scale L0. At this time, the blue pixel units B in the $(3n)^{th}$ rows do not emit light, i.e., the gray scale thereof is L0.

At this time, the frame picture is displayed as a red picture, and the display gray scale of each red pixel unit R is L255. During the display of the red picture, the number of changes of the data voltage loaded in each of the data lines D1 to D12 is 1, i.e., from Vdata_L255 to Vdata_L0. For the case that the monochrome picture is a picture of any other color, the technical solutions of the present disclosure are not illustrated one by one. As may be seen from the above, the solution of the present disclosure may reduce the number of changes in the data voltage loaded in the data line per unit time (e.g., one frame time), thereby reducing power consumption and coupling interference.

FIGS. 2 to 3 show an embodiment in which the pixel array includes the plurality of color mixing pixel columns, which are identical. In this embodiment, each periodic structure of each color mixing pixel column includes three pixel units, e.g., the red pixel unit, the green pixel unit, and the blue pixel unit. The present disclosure is not limited thereto and each periodic structure of each color mixing pixel column may include four different color pixel units, for example, a red pixel unit, a green pixel unit, a blue pixel unit, and a yellow pixel unit.

Figure 4:
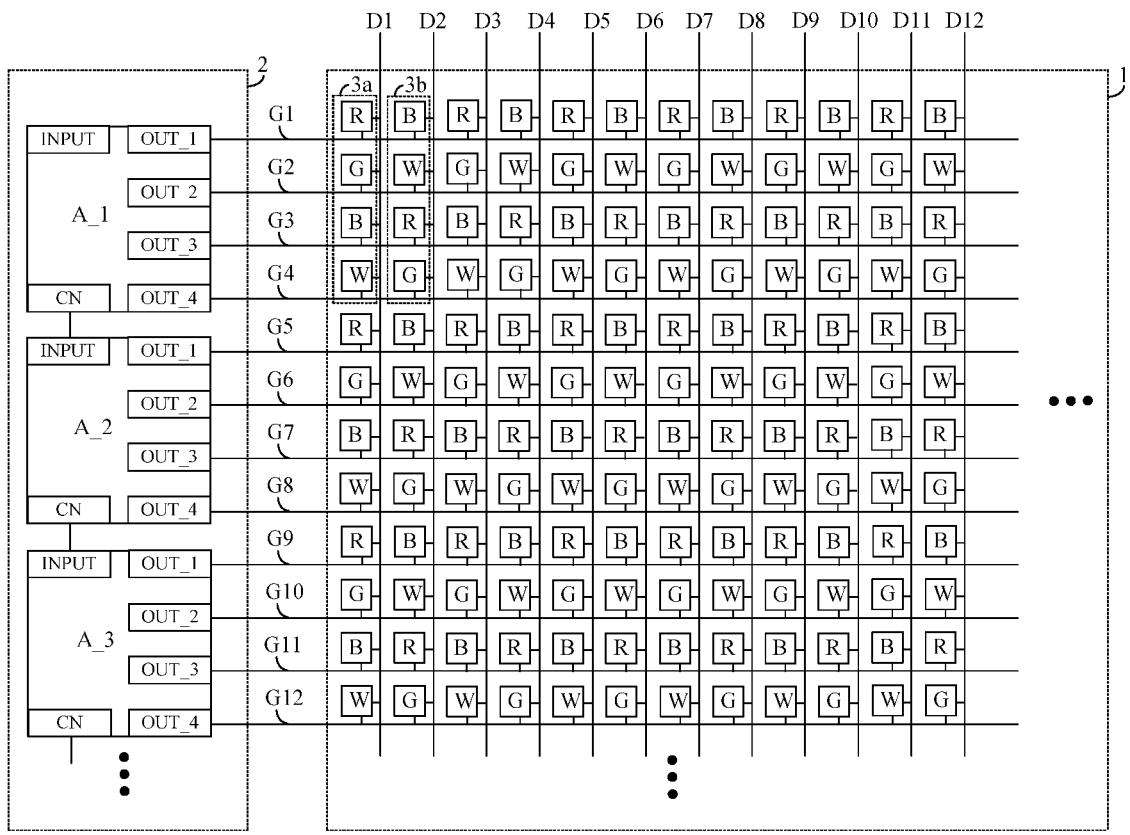
FIG. 4 is a schematic diagram of a structure of a display substrate according to an embodiment of the present disclosure.

FIG. 4 is a schematic diagram of a structure of another display substrate provided in an embodiment of the present disclosure. As shown in FIG. 4, the display substrate shown in FIG. 4 is a special and optional implementation of the display substrate shown in FIG. 1. Specifically, in the pixel array 1, pixel units included in the periodic structures 3a and 3b in different color mixing pixel columns have same types but are arranged in different orders.

Illustratively, referring to FIG. 4, the pixel array 1 includes four types of pixel units emitting light of different colors: a red pixel unit R emitting red light, a green pixel unit G emitting green light, a blue pixel unit B emitting blue light, and a white pixel unit W emitting white light.

In the pixel array 1, each pixel column is a color mixing pixel column, and each of the periodic structures 3a, 3b of each color mixing pixel column includes 4 pixel units: one red pixel unit R, one green pixel unit G, one blue pixel unit B, and one white pixel unit W. In the periodic structure 3a corresponding to the color mixing pixel column in each odd-numbered column, the red pixel unit R, the green pixel unit G, the blue pixel unit B and the white pixel unit W are arranged in sequence in the column direction; in the periodic structure 3b corresponding to the color mixing pixel column in each even-numbered column, the blue pixel unit B, the white pixel unit W, the red pixel unit R, and the green pixel unit G are arranged in sequence in the column direction.

Correspondingly, each of the shift registers A_1 to A_3 in the gate driving circuit 2 is provided with N=4 scanning signal output terminals; illustratively, first scanning signal output terminals OUT_1 of the shift registers in the $n^{th}$ stages are respectively connected to the gate lines (such as the gate lines G1, G5, G9) in the $(4n-3)^{th}$ rows; second scanning signal output terminals OUT_2 of the shift registers in the $n^{th}$ stages are respectively connected to the gate lines (such as the gate lines G2, G6, G10) in the $(4n-2)^{th}$ rows; third scanning signal output terminals OUT_3 of the shift registers in the $n^{th}$ stages are connected to the gate lines (such as the gate lines G3, G7, G11) in the $(4n-1)^{th}$ rows; and fourth scanning signal output terminals OUT_4 of the shift registers in the $n^{th}$ stages are connected to the gate lines (such as the gate lines G4, G8, G12) in the $(4n)^{th}$ rows.

In a display driving method, one frame time is divided into N=4 driving stages. In the display driving procedure, respective driving stages are performed in sequence, wherein in the $i^{th}$ driving stage, the cascading signal output terminals CN of the respective stages of the shift registers A_1 to A_3 in the gate driving circuit 2 output cascading signals in sequence; and for any one of the shift registers A_1 to A_3, during it outputs the cascading signal, the $i^{th}$ scanning signal output terminal OUT_i of the shift register outputs a scanning signal, $1 \leq i \leq N$, and i is an integer. Each of gate lines G1 to G12 in the display substrate may be driven based on the display driving method.

Figure 5:
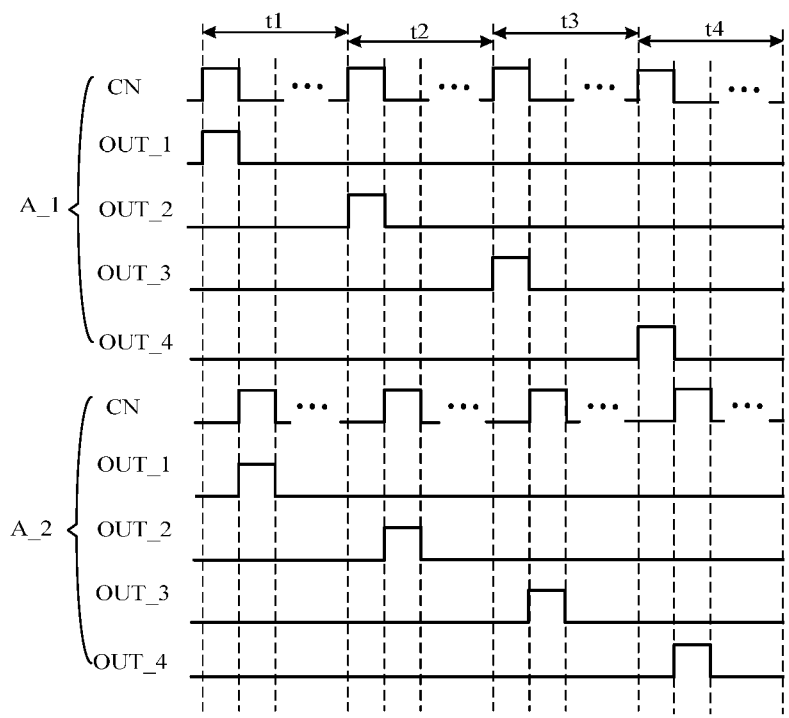
FIG. 5 is a driving timing diagram illustrating that the display substrate of FIG. 4 displays a red color picture.

FIG. 5 is a driving timing diagram illustrating that the display substrate of FIG. 4 displays a red color picture. As shown in FIG. 5, it is assumed that a display gray scale of each red pixel unit R in the red color picture is L255 and a frame time includes N=4 driving stages.

In a first driving stage t1, the cascading signal output terminals CN of the shift registers A_1 to A_3 sequentially output cascading signals; the first scanning signal output terminals OUT_1 of the shift registers A_1 to A_3 sequentially output scanning signals; the gate lines (such as the gate lines G1, G5, G9) in the $(4n-3)^{th}$ rows in the display region are sequentially loaded with the scanning signals; the data voltage loaded in each of the data lines D1, D3, D5, D7, D9 and D11 in the odd-numbered columns is Vdata_L255; the data voltage loaded in each of the data lines D2, D4, D6, D8, D10 and D12 in the even-numbered columns is Vdata_L0.

In a second driving stage t2, the cascading signal output terminals CN of the shift registers A_1 to A_3 sequentially output cascading signals; the second scanning signal output terminals OUT_2 of the shift registers A_1 to A_3 sequentially output scanning signals; the gate lines (such as the gate lines G2, G6, G10) in the $(4n-2)^{th}$ rows in the display region are sequentially loaded with scanning signals; the data voltage loaded in each of the data lines D1, D3, D5, D7, D9 and D11 in the odd-numbered columns is Vdata_L0; the data voltage loaded in each of the data lines D2, D4, D6, D8, D10 and D12 in the even-numbered columns is Vdata_L0.

In a third driving stage t3, the cascading signal output terminals CN of the shift registers A_1 to A_3 sequentially output cascading signals; the third scanning signal output terminals OUT_3 of the shift registers A_1 to A_3 sequentially output scanning signals; the gate lines (such as the gate lines G3, G7, and G11) in the $(4n-1)^{th}$ rows in the display region are sequentially loaded with the scanning signals; the data voltage loaded in each of the data lines D1, D3, D5, D7, D9 and D11 in the odd-numbered columns is Vdata_L0; the data voltage loaded in each of the data lines D2, D4, D6, D8, D10 and D12 in the even-numbered columns is Vdata_L255.

In a fourth driving stage t4, the cascading signal output terminals CN of the shift registers A_1 to A_3 sequentially output cascading signals; the fourth scanning signal output terminals OUT_4 of the shift registers A_1 to A_3 sequentially output scanning signals; the gate lines (such as the gate lines G4, G8, and G12) in the $(4n)^{th}$ rows in the display region are sequentially loaded with the scanning signals; the data voltage loaded in each of the data lines D1, D3, D5, D7, D9 and D11 in the odd-numbered columns is Vdata_L0; the data voltage loaded in each of the data lines D2, D4, D6, D8, D10 and D12 in the even-numbered columns is Vdata_L0.

At this time, the frame picture is displayed as a red picture, and the display gray scale of each red pixel unit R is L255. During the display of the red picture, the number of changes of the data voltage loaded in each of the data lines D1, D3, D5, D7, D9 and D11 in the odd-numbered columns is 1, i.e., from Vdata_L255 to Vdata_L0; the number of changes of the data voltage loaded in each of the data lines D2, D4, D6, D8, D10 and D12 in the even-numbered columns is 2, i.e., from Vdata_L0 to Vdata_L255 and then, from Vdata_L255 to Vdata_L0.

For the case that the monochrome picture is a picture of any other color, the technical solutions of the present disclosure are not illustrated one by one. As may be seen from the above, the solution of the present disclosure may reduce the number of the changes in the data voltage loaded in the data line per unit time (e.g., one frame time), thereby reducing power consumption and coupling interference.

Figure 6:
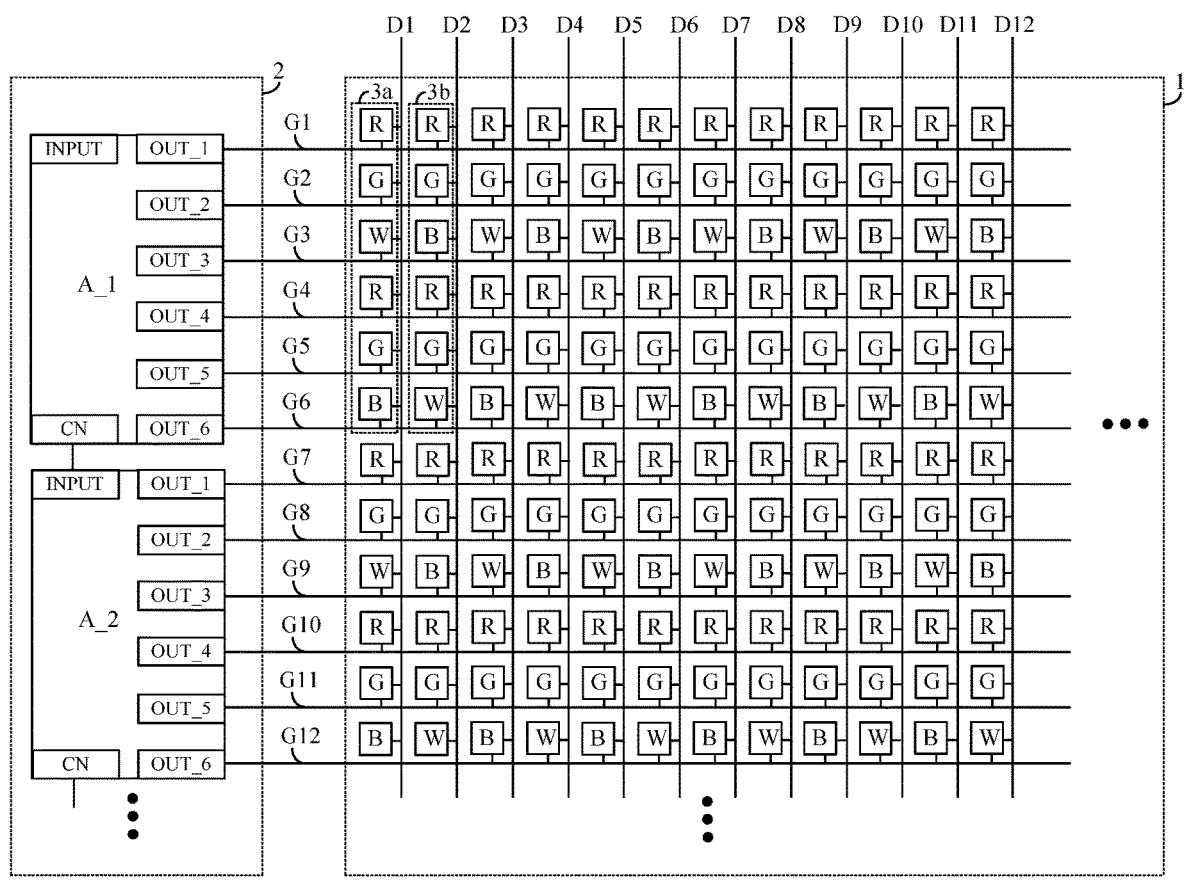
FIG. 6 is a schematic diagram of a structure of a display substrate according to an embodiment of the present disclosure.

FIG. 6 is a schematic diagram of a structure of another display substrate according to an embodiment of the present disclosure. As shown in FIG. 6, in the pixel array 1, pixel units included in the periodic structures 3a and 3b in different color mixing pixel columns have same types but are arranged in different orders.

Illustratively, referring to FIG. 6, the pixel array 1 includes four types of pixel units emitting light of different colors, respectively: a red pixel unit R emitting red light, a green pixel unit G emitting green light, a blue pixel unit B emitting blue light, and a white pixel unit W emitting white light. In the pixel array 1, each pixel column is a color mixing pixel column. Unlike the case shown in FIG. 4, in the display substrate shown in FIG. 6, each of the periodic structures 3a, 3b of each color mixing pixel column includes six pixel units: two red pixel units R, two green pixel units G, one blue pixel unit B, and one white pixel unit W.

In the periodic structure 3a corresponding to the color mixing pixel column in each odd-numbered column, the red pixel unit R, the green pixel unit G, the white pixel unit W, the red pixel unit R, the green pixel unit G and the blue pixel unit B are arranged in sequence in a direction from the shift register A_1 pointing to the shift register A_2; in the periodic structure 3b corresponding to the color mixing pixel column in each even-numbered column, the red pixel unit R, the green pixel unit G, the blue pixel unit B, the red pixel unit R, the green pixel unit G, and the white pixel unit W are arranged in sequence in a direction from the shift register A_1 pointing to the shift register A_2.

Correspondingly, each of the shift registers in the gate driving circuit 2 is provided with N=6 scanning signal output terminals OUT_1 to OUT_6; illustratively, first scanning signal output terminals OUT_1 of the shift registers in the $n^{th}$ stages are connected to the gate lines (such as the gate lines G1, G7) in the $(6n-5)^{th}$ rows; second scanning signal output terminals OUT_2 of the shift registers in the $n^{th}$ stages are connected to the gate lines (such as the gate lines G2, G8) in the $(6n-4)^{th}$ rows; third scanning signal output terminals OUT_3 of the shift registers in the $n^{th}$ stages are connected to the gate lines (such as the gate lines G3, G9) in the $(6n-3)^{th}$ rows; and fourth scanning signal output terminals OUT_4 of the shift registers in the $n^{th}$ stages are connected to the gate lines (such as the gate lines G4, G10) in the $(6n-2)^{th}$ rows; fifth scanning signal output terminals OUT_5 of the shift registers in the $n^{th}$ stages are connected to the gate lines (such as the gate lines G5, G11) in the $(6n-1)^{th}$ rows; and sixth scanning signal output terminals OUT_6 of the shift registers in the $n^{th}$ stages are connected to the gate lines (such as the gate lines G6, G12) in the $(6n)^{th}$ rows.

In a display driving method, one frame time is divided into N=6 driving stages. In the display driving procedure, respective driving stages are performed in sequence, wherein in the $i^{th}$ driving stage, the cascading signal output terminals CN of the respective stages of the shift registers in the gate driving circuit 2 output cascading signals in sequence; and for any one of the shift registers A_1 to A_2, during it outputs the cascading signal, the $i^{th}$ scanning signal output terminal OUT_i of the shift register outputs a scanning signal, $1 \leq i \leq N$, and i is an integer. Each gate line G1 to G12 in the display substrate may be driven based on the display driving method.

Figure 7:
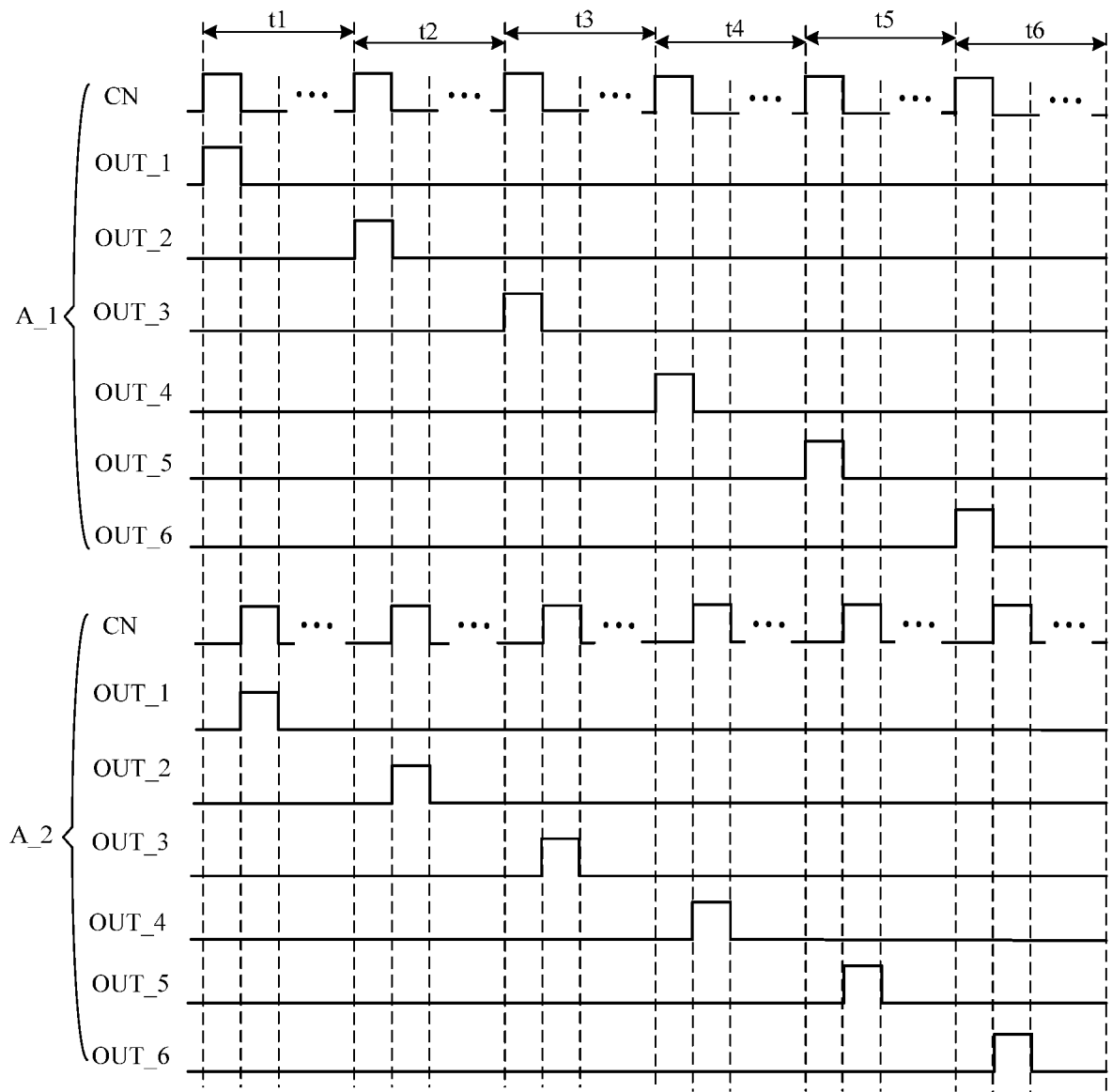
FIG. 7 is a driving timing diagram illustrating the display substrate of FIG. 6 displays a blue color picture.

FIG. 7 is a driving timing diagram illustrating that the display substrate of FIG. 6 displays a blue color picture. As shown in FIG. 7, it is assumed that a display gray scale of each blue pixel unit B in the blue color picture is L255 and a frame time includes N=6 driving stages.

In a first driving stage t1, the cascading signal output terminals CN of the shift registers A_1 to A_2 sequentially output cascading signals; the first scanning signal output terminals OUT_1 of the shift registers A_1 to A_2 sequentially output scanning signals; the gate lines (such as the gate lines G1, G7) in the $(6n-5)^{th}$ rows in the display region are sequentially loaded with the scanning signals; the data voltage loaded in each of the data lines D1 to D12 is Vdata_L0.

In a second driving stage t2, the cascading signal output terminals CN of the shift registers A_1 to A_2 sequentially output cascading signals; the second scanning signal output terminals OUT_2 of the shift registers A_1 to A_2 sequentially output scanning signals; the gate lines (such as the gate lines G2, G8) in the $(6n-4)^{th}$ rows in the display region are sequentially loaded with scanning signals; the data voltage loaded in each of the data lines D1 to D12 is Vdata_L0.

In a third driving stage t3, the cascading signal output terminals CN of the shift registers A_1 to A_2 sequentially output cascading signals; the third scanning signal output terminals OUT_3 of the shift registers A_1 to A_2 sequentially output scanning signals; the gate lines (such as the gate lines G3, G9) in the $(6n-3)^{th}$ rows in the display region are sequentially loaded with the scanning signals; the data voltage loaded in each of the data lines D1, D3, D5, D7, D9 and D11 in the odd-numbered columns is Vdata_L0; the data voltage loaded in each of the data lines D2, D4, D6, D8, D10 and D12 in the even-numbered columns is Vdata_L255.

In a fourth driving stage t4, the cascading signal output terminals CN of the shift registers A_1 to A_2 sequentially output cascading signals; the fourth scanning signal output terminals OUT_4 of the shift registers A_1 to A_2 sequentially output scanning signals; the gate lines (such as the gate lines G4 and G10) in the (6n−2)$^{th}$ rows in the display region are sequentially loaded with the scanning signals; the data voltage loaded in each of the data lines D1 to D12 is Vdata_L0.

In a fifth driving stage t5, the cascading signal output terminals CN of the shift registers A_1 to A_2 sequentially output cascading signals; the fifth scanning signal output terminals OUT_5 of the shift registers A_1 to A_2 sequentially output scanning signals; the gate lines (such as the gate lines G5, G11) in the (6n−1)$^{th}$ rows in the display region are sequentially loaded with scanning signals; the data voltage loaded in each of the data lines D1 to D12 is Vdata_L0.

In a sixth driving stage t6, the cascading signal output terminals CN of the shift registers A_1 to A_2 sequentially output cascading signals; the sixth scanning signal output terminals OUT_6 of the shift registers A_1 to A_2 sequentially output scanning signals; the gate lines (such as the gate lines G6, G12) in the (6n)$^{th}$ rows in the display region are sequentially loaded with the scanning signals; the data voltage loaded in each of the data lines in the odd-numbered columns is Vdata_L255; the data voltage loaded in each of the data lines in the even-numbered columns is Vdata_L0.

At this time, the frame picture is displayed as a blue picture, and the display gray scale of each blue pixel unit B is L255. During the display of the blue picture, the number of changes of the data voltage loaded in each of the data lines in the odd-numbered columns is 1, i.e., from Vdata_L0 to Vdata_L255; the number of changes of the data voltage loaded in each of the data lines in the even-numbered columns is 2, i.e., from Vdata_L0 to Vdata_L255 and then, from Vdata_L255 to Vdata_L0.

For the case that the monochrome picture is a picture of any other color, the technical solutions of the present disclosure are not illustrated one by one. As may be seen from the above, the solution of the present disclosure may reduce the number of the changes in the data voltage loaded in the data line per unit time (e.g., one frame time), thereby reducing power consumption and coupling interference.

In the pixel array of the display substrate shown in each of FIGS. 4 and 6 described above, the plurality of color mixing pixel columns include two different types of color mixing pixel columns, i.e., a plurality of first color mixing pixel columns in odd-numbered columns and a plurality of second color mixing pixel columns in even-numbered columns. Each first color mixing pixel column includes a plurality of first periodic structures 3a arranged along the column direction; each second color mixing pixel column includes a plurality of second periodic structures 3b arranged in the column direction. Each first periodic structure 3a includes a first periodic sub-structure and a second periodic sub-structure arranged in sequence along the column direction, and each second periodic structure 3b includes the second periodic sub-structure and the first periodic sub-structure arranged in sequence along the column direction. Accordingly, the first color mixing pixel column is formed by alternately arranging the plurality of first periodic sub-structures and the plurality of second periodic sub-structures along the column direction. For example, in the embodiment shown in FIG. 4, the first periodic sub-structure includes a red pixel unit and a green pixel unit, while the second periodic sub-structure includes a blue pixel unit and a white pixel unit. In the embodiment shown in FIG. 6, the first periodic sub-structure includes red, green and white pixel units, while the second periodic sub-structure includes red, green and blue pixel units.

Figure 8:
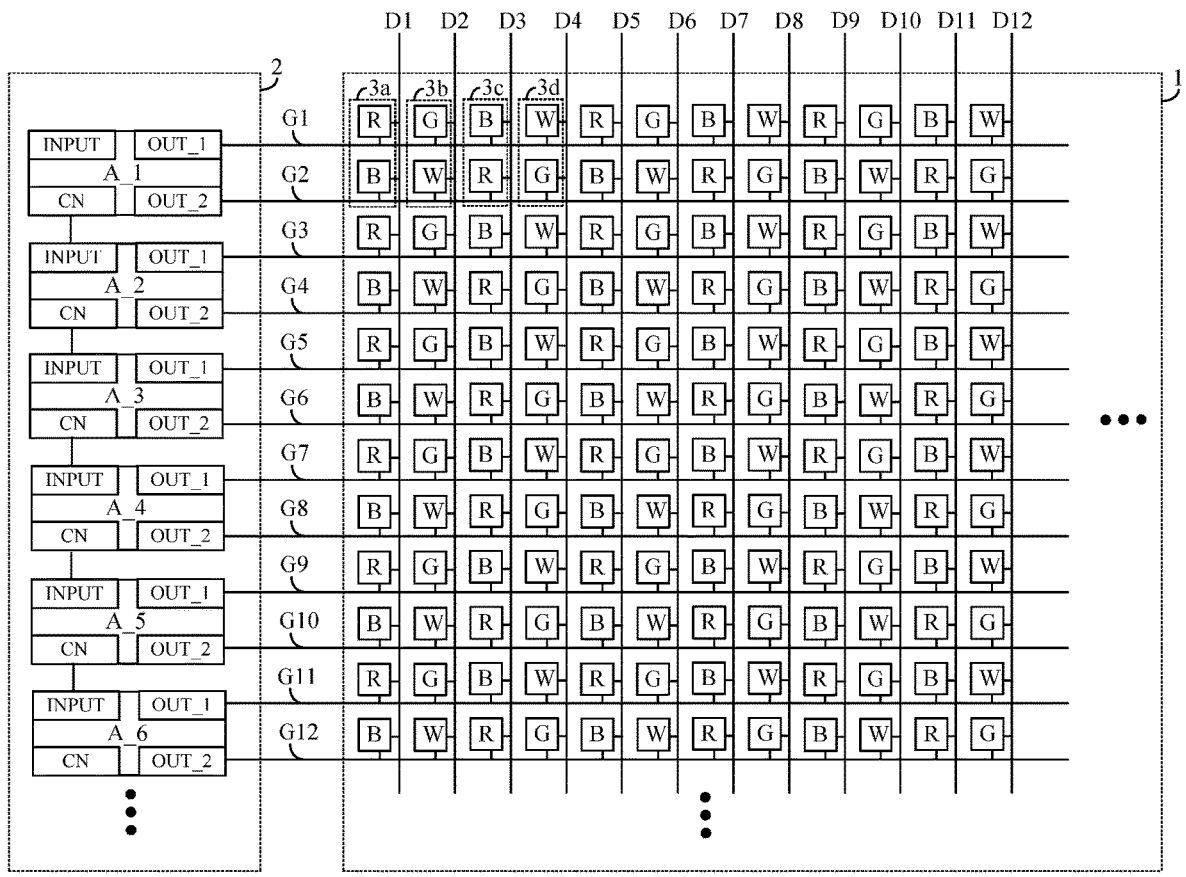
FIG. 8 is a schematic diagram of a structure of a display substrate according to an embodiment of the present disclosure.

FIG. 8 is a schematic diagram of a structure of a display substrate provided in an embodiment of the present disclosure. As shown in FIG. 8, the display substrate shown in FIG. 8 is a special and optional implementation of the display substrate shown in FIG. 1. Specifically, in the pixel array 1, pixel units included in each of the periodic structures 3a, 3b, 3c and 3d in different color mixing pixel columns have different types and are arranged in different manners. That is, the plurality of color mixing pixel columns included in the pixel array include a first color mixing pixel column, a second color mixing pixel column, a third color mixing pixel column, and a fourth color mixing pixel column that are different from each other and are arranged in the row direction. The first color mixing pixel column includes a plurality of first periodic structures 3a arranged in sequence along the column direction; the second color mixing pixel column includes a plurality of second periodic structures 3b arranged in sequence along the column direction; the third color mixing pixel column includes a plurality of third periodic structures 3c arranged in sequence along the column direction; and the fourth color mixing pixel column includes a plurality of fourth periodic structures 3d arranged in sequence along the column direction. One first color mixing pixel column, one second color mixing pixel column, one third color mixing pixel column, and one fourth color mixing pixel column arranged in sequence in the row direction are regarded, as a whole, as one color mixing pixel column period, such that the plurality of first color mixing pixel columns, the plurality of second color mixing pixel columns, the plurality of third color mixing pixel columns, and the plurality of fourth color mixing pixel columns form a plurality of color mixing pixel column periods arranged in sequence in the row direction to form the pixel array.

Illustratively, referring to FIG. 8, the pixel array 1 includes four pixel units emitting light of different colors, respectively: a red pixel unit R emitting red light, a green pixel unit G emitting green light, a blue pixel unit B emitting blue light, and a white pixel unit W emitting white light.

In the pixel array 1, each pixel column is a color mixing pixel column, and each of the periodic structures 3a, 3b, 3c, 3d of each color mixing pixel column includes two pixel units. The periodic structure 3a corresponding to the color mixing pixel column in the (4j−3)$^{th}$ column includes: one red pixel unit R and one blue pixel unit B, which are arranged in sequence in a direction from the shift register A_1 pointing to the shift register A_2. The periodic structure 3b corresponding to the color mixing pixel column in the (4j−2)$^{th}$ column includes: one green pixel unit G and one white pixel unit W, which are arranged in sequence in a direction from the shift register A_1 pointing to the shift register A_2. The periodic structure 3c corresponding to the color mixing pixel column in the (4j−1)$^{th}$ column includes: one blue pixel unit B and one red pixel unit R, which are arranged in sequence in a direction from the shift register A_1 pointing to the shift register A_2. The periodic structure 3d corresponding to the color mixing pixel column in the (4j)$^{th}$ column includes: one white pixel unit W and one green pixel unit G, which are arranged in sequence in a direction from the shift register A_1 pointing to the shift register A_2.

Correspondingly, each of shift registers A_1 to A_6 in the gate driving circuit 2 is provided with N=2 scanning signal output terminals OUT_1 to OUT_2. Illustratively, the first scanning signal output terminals OUT_1 of the shift registers in the n$^{th}$ stages are connected to the (2n−1)$^{th}$ gate lines (such as the gate lines G1, G3, G5, G7, G9, G11), the second scanning signal output terminals OUT_2 of the shift registers in the n$^{th}$ stages are connected to the (2n)$^{th}$ gate lines (such as the gate lines G2, G4, G6, G8, G10, G12).

In a display driving method, one frame time is divided into N=2 driving stages. In the display driving procedure, respective driving stages are performed in sequence, wherein in the $i^{th}$ driving stage, the cascading signal output terminals CN of the respective stages of the shift registers A_1 to A_6 in the gate driving circuit 2 output cascading signals in sequence; and for any one of the shift registers A_1 to A_6, during it outputs the cascading signal, the $i^{th}$ scanning signal output terminal OUT_i of the shift register outputs a scanning signal, $1 \leq i \leq N$, and i is an integer. Each of the gate lines G1 to G12 in the display substrate may be driven based on the display driving method.

Figure 9:
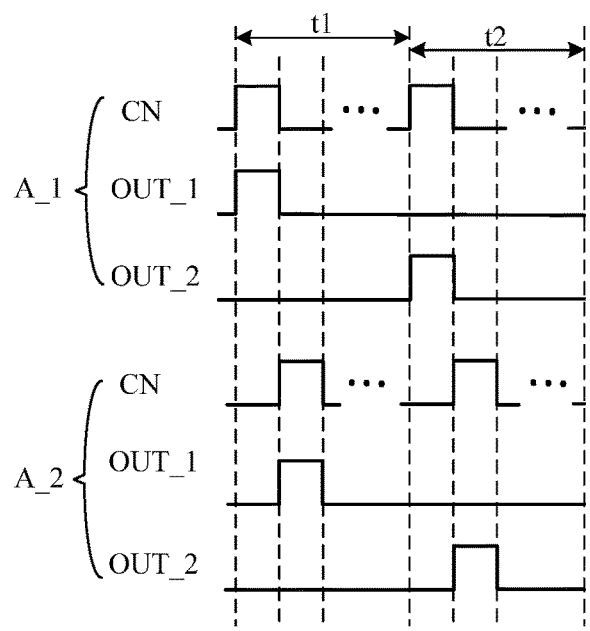
FIG. 9 is a driving timing diagram illustrating that the display substrate of FIG. 8 displays a red color picture.

FIG. 9 is a driving timing diagram illustrating that the display substrate of FIG. 8 displays a red color picture. As shown in FIG. 9, it is assumed that a display gray scale of each red pixel unit R in the red color picture is L255 and a frame time includes N=2 driving stages.

In a first driving stage t1, the cascading signal output terminals CN of the shift registers sequentially output cascading signals; the first scanning signal output terminals OUT_1 of the shift registers sequentially output scanning signals; the gate lines in the $(2n-1)^{th}$ rows in the display region are sequentially loaded with the scanning signals; the data voltage loaded in each of the data lines in the $(4j-3)^{th}$ columns is Vdata_L255; the data voltage loaded in each of the data lines in the $(4j-2)^{th}$ columns, the $(4j-1)^{th}$ columns and the $(4j)^{th}$ columns is Vdata_L0.

In a second driving stage t2, the cascading signal output terminals CN of the shift registers sequentially output cascading signals; the second scanning signal output terminals OUT_2 of the shift registers sequentially output scanning signals; the gate lines in the $(2n)^{th}$ rows in the display region are sequentially loaded with the scanning signals; the data voltage loaded in each of the data lines in the $(4j-1)^{th}$ columns is Vdata_L255; the data voltage loaded in each of the data lines in the $(4j-3)^{th}$ columns, the $(4j-2)^{th}$ columns and the $(4j)^{th}$ columns is Vdata_L0.

At this time, the frame picture is displayed as a red picture, and the display gray scale of each red pixel unit R is L255. During the display of the red picture, the number of changes of the data voltage loaded in each of the data lines in the $(4j-3)^{th}$ columns is 1, i.e., from Vdata_L255 to Vdata_L0; the number of changes of the data voltage loaded in each of the data lines in the $(4j-2)^{th}$ columns is 0, i.e., the data voltage is kept as Vdata_L0; the number of changes of the data voltage loaded in each of the data lines in the $(4j-1)^{th}$ columns is 1, i.e., from Vdata_L0 to Vdata_L255; the number of changes of the data voltage loaded in each of the data lines in the $(4j)^{th}$ columns is 0, i.e., the data voltage is kept as Vdata_L0.

For the case that the monochrome picture is a picture of any other color, the technical solutions of the present disclosure are not illustrated one by one. As may be seen from the above, the solution of the present disclosure may reduce the number of changes in the data voltage loaded in the data line per unit time (e.g., one frame time), thereby reducing power consumption and coupling interference.

Figure 10:
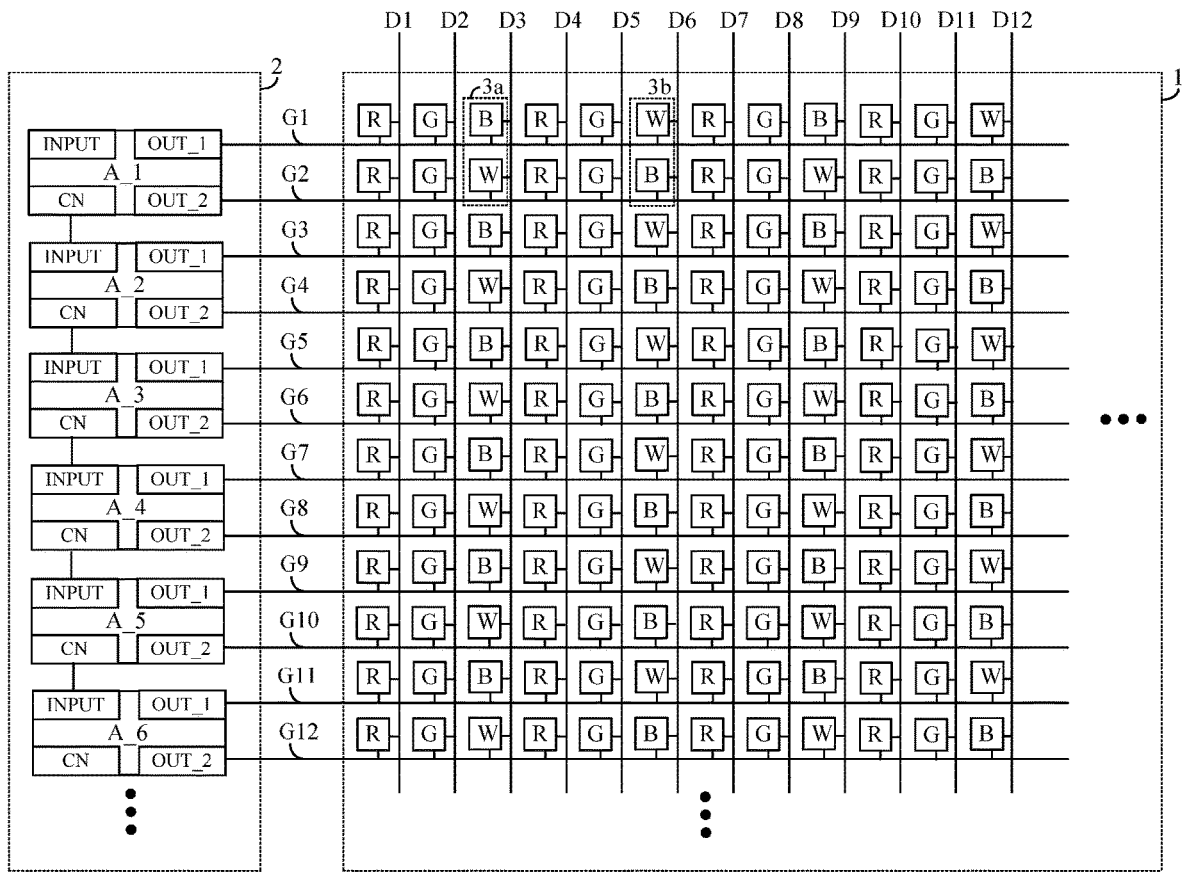
FIG. 10 is a schematic diagram of a structure of a display substrate according to an embodiment of the present disclosure.

FIG. 10 is a schematic diagram of a structure of a display substrate according to an embodiment of the present disclosure. As shown in FIG. 10, the display substrate shown in FIG. 10 is a special and optional implementation of the display substrate shown in FIG. 1. Specifically, the pixel array 1 includes not only the color mixing pixel columns but also monochrome pixel columns each including pixel units emitting light of the same color.

Illustratively, referring to FIG. 10, the pixel array 1 includes four types of pixel units emitting light of different colors, respectively: a red pixel unit R emitting red light, a green pixel unit G emitting green light, a blue pixel unit B emitting blue light, and a white pixel unit W emitting white light.

In the pixel array 1, $(3j-2)^{th}$ and $(3j-1)^{th}$ pixel columns are monochrome pixel columns; $(3j)^{th}$ pixel columns are color mixing pixel columns, and each of the periodic structures of the color mixing pixel columns includes two pixel units. The monochrome pixel columns in the $(3j-2)^{th}$ columns include red pixel units R, and the monochrome pixel columns in the $(3j-1)^{th}$ columns include green pixel units G; each of the periodic structures 3a and 3b corresponding to the color mixing pixel columns in the $(3j)^{th}$ columns includes: one blue pixel unit B and one white pixel unit W. The periodic structures 3a corresponding to each of color mixing pixel columns in the $(6j-3)^{th}$ columns include the blue pixel units B and the white pixel units W alternately arranged in sequence in a direction from the shift register A_1 pointing to the shift register A_2; the periodic structures 3b corresponding to each of color mixing pixel columns in the $(6j)^{th}$ columns include the white pixel units W and the blue pixel units B alternately arranged in sequence in a direction from the shift register A_1 pointing to the shift register A_2.

That is, in this embodiment, the pixel array includes a plurality of first color mixing pixel columns and a plurality of second color mixing pixel columns alternately arranged along the row direction. Each periodic structure of the first color mixing pixel column includes a blue pixel unit and a white pixel unit; and each periodic structure of the second color mixing pixel column includes a white pixel unit and a blue pixel unit. A first monochrome pixel column (e.g., formed by the plurality of red pixel units) and a second monochrome pixel column (e.g., formed by the plurality of green pixel units) are present between every adjacent first and second color mixing pixel columns.

Correspondingly, each of the shift registers A_1 to A_6 in the gate driving circuit 2 is provided with N=2 scanning signal output terminals OUT_1 to OUT_2. Illustratively, the first scanning signal output terminals OUT_1 of the shift registers A_1 to A_6 in the $n^{th}$ stages are respectively connected to the $(2n-1)^{th}$ gate lines, and the second scanning signal output terminals OUT_2 of the shift registers in the $n^{th}$ stages are respectively connected to the $(2n)^{th}$ gate lines.

In a display driving method for the display panel, one frame time is divided into N=2 driving stages. In the display driving procedure, respective driving stages are performed in sequence, wherein in the $i^{th}$ driving stage, the cascading signal output terminals CN of the respective stages of the shift registers in the gate driving circuit 2 output cascading signals in sequence; and for any one of the shift registers, during it outputs the cascading signal, the $i^{th}$ scanning signal output terminal OUT_i of the shift register outputs a scanning signal, $1 \leq i \leq N$, and i is an integer. Each of the gate lines in the display substrate may be driven based on the display driving method.

The display substrate shown in FIG. 10 may adopt the driving timing diagram shown in FIG. 9 to display a blue color picture. With reference to FIG. 9 again, it is assumed that a display gray scale of each blue pixel unit B in the blue color frame is L255 and a frame time includes N=2 driving stages.

In a first driving stage t1, the cascading signal output terminals CN of the shift registers sequentially output cascading signals; the first scanning signal output terminals OUT_1 of the shift registers sequentially output scanning signals; the gate lines (such as the gate lines G1, G3, G5, G7, G9, G11) in the $(2n-1)^{th}$ rows in the display region are sequentially loaded with the scanning signals; the data voltage loaded in each of the data lines (such as the data lines D3, D9) in the $(6j-3)^{th}$ columns is Vdata_L255; the data voltage loaded in each of the data lines (such as the data lines D1, D2, D4 to D8 and D10 to D12) in the $(6j-5)^{th}$ columns, the $(6j-4)^{th}$ columns, the $(6j-2)^{th}$ columns, the $(6j-1)^{th}$ columns and the $(6j)^{th}$ columns is Vdata_L0.

In a second driving stage t2, the cascading signal output terminals CN of the shift registers sequentially output cascading signals; the second scanning signal output terminals OUT_2 of the shift registers sequentially output scanning signals; the gate lines (such as the gate lines G2, G4, G6, G8, G10, G12) in the $(2n)^{th}$ rows in the display region are sequentially loaded with the scanning signals; the data voltage loaded in each of the data lines (such as the data lines D6, D12) in the $(6j)^{th}$ columns is Vdata_L255; the data voltage loaded in each of the data lines (such as the data lines D1 to D5, D7 to D11) in the $(6j-5)^{th}$ columns to the $(6j-1)^{th}$ columns is Vdata_L0.

At this time, the frame picture is displayed as a blue picture, and the display gray scale of each blue pixel unit B is L255. During the display of the blue picture, the data voltage loaded in each of the data lines (such as the data lines D1, D2, D4, D5, D7, D8, D10, D11) in the $(6j-5)^{th}$ columns, the $(6j-4)^{th}$ columns, the $(6j-2)^{th}$ columns, the $(6j-1)^{th}$ columns is kept as Vdata_L0; the number of changes of the data voltage loaded in each of the data lines (such as the data lines D3, D9) in the $(6j-3)^{th}$ columns is 1, i.e., from Vdata_L255 to Vdata_L0; the number of changes of the data voltage loaded in each of the data lines (such as the data lines D6, D12) in the $(6j)^{th}$ columns is 1, i.e., from Vdata_L0 to Vdata_L255.

For the case that the monochrome picture is a picture of any other color, the technical solutions of the present disclosure are not illustrated one by one. As may be seen from the above, the solution of the present disclosure may reduce the number of changes in the data voltage loaded in the data line per unit time (e.g., one frame time), thereby reducing power consumption and coupling interference.

It should be noted that, in the technical solution of the present disclosure, the types and arrangement manners of the pixel units in the display substrate are not limited, as long as the display substrate includes the color mixing pixel columns, and the number of the pixel units included in each periodic structure in the color mixing pixel columns is constant.

Figure 11:
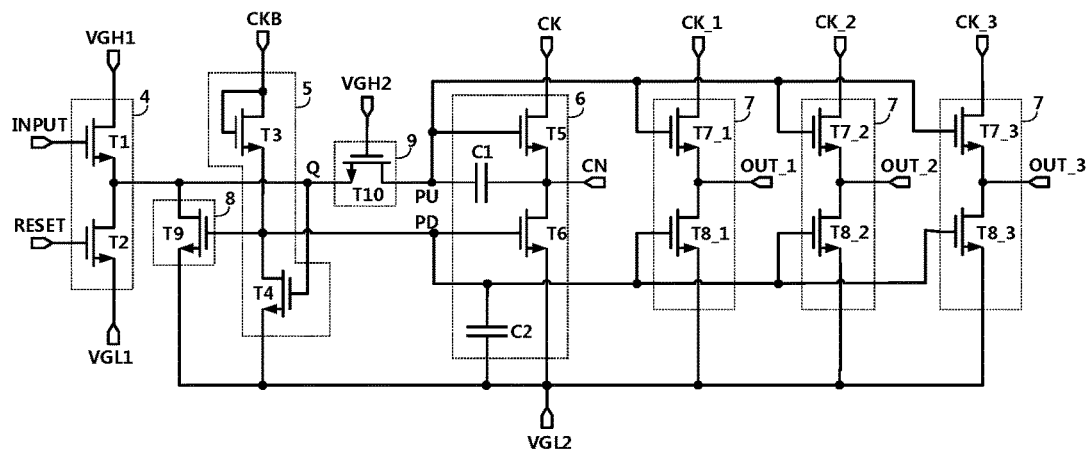
FIG. 11 is a schematic diagram of a circuit structure of a shift register according to an embodiment of the present disclosure.

FIG. 11 is a schematic circuit diagram of a shift register according to an embodiment of the present disclosure. As shown in FIG. 11, in some embodiments, the shift register includes: a pre-charging reset circuit 4, a voltage control circuit 5, a cascading output circuit 6 and a plurality of scanning output circuits 7, wherein the plurality of scanning output circuits 7 correspond to the plurality of scanning signal output terminals OUT_1 to OUT_3 one by one; the pre-charging reset circuit 4, the voltage control circuit 5, the cascading output circuit 6 and the plurality of scanning output circuits 7 are coupled to a first node PU; and the voltage control circuit 5, the cascading output circuit 6 and the plurality of scanning output circuits 7 are coupled to a second node PD.

The number of the plurality of scanning output circuits 7 is equal to the number of the pixel units included in the periodic structure; three scanning output circuits 7 is shown only by way of example in FIG. 12. Accordingly, the number of the scanning signal output terminals OUT_1 to OUT_3 is also 3.

The pre-charging reset circuit 4 is coupled to a signal input terminal INPUT, a reset signal terminal RESET, a first power supply terminal VGH1, and a second power supply terminal VGL1, and is configured to write a first operating voltage provided by the first power supply terminal VGH1 to the first node (pull-up node) PU in response to a control of a signal provided by the signal input terminal INPUT, and write a second operating voltage provided by the second power supply terminal VGL1 to the first node PU in response to a control of a signal provided by the reset signal terminal RESET.

The voltage control circuit 5 is coupled to a third power supply terminal VGL2 and a second clock signal terminal CKB, and is configured to write a third operating voltage provided by the third power supply terminal VGL2 to the second node (pull-down node) PD in response to a control of a voltage at the first node PU, or to write a second clock signal to the second node in response to a control of the second clock signal provided by the second clock signal terminal CKB.

The cascading output circuit 6 is coupled to a first clock signal terminal CK, the third power supply terminal VGL2, and the cascading signal output terminal CN, and is configured to write a first clock signal provided by the first clock signal terminal CK to the cascading signal output terminal CN in response to a control of a voltage at the first node PU, and write the third operating voltage to the cascading signal output terminal CN in response to a control of a voltage at the second node PD.

The scanning output circuits 7 are coupled to the corresponding scanning clock signal terminals CK_1 to CK_3, the third power supply terminal VGL2, and the corresponding scanning signal output terminals OUT_1 to OUT_3, and are configured to write scanning clock signals provided by the corresponding scanning clock signal terminals CK_1 to CK_3 to the corresponding scanning signal output terminals OUT_1 to OUT_3, respectively, in response to a control of the voltage at the first node PU, and to write the third operating voltage to the scanning signal output terminals OUT_1 to OUT_3 in response to a control of the voltage at the second node PD.

For convenience of description, the three scanning signal output terminals shown in FIG. 11 are respectively referred to as a first scanning signal output terminal OUT_1, a second scanning signal output terminal OUT_2, and a third scanning signal output terminal OUT_3; and the three scanning clock signal terminals are respectively referred to as a first scanning clock signal terminal CK_1, a second scanning clock signal terminal CK_2, and a third scanning clock signal terminal CK_3. The scanning clock signals provided by the first scanning clock signal terminal CK_1, the second scanning clock signal terminal CK_2, and the third scanning clock signal terminal CK_3 may be controlled independently of each other, respectively.

In some embodiments, the pre-charging reset circuit 4 includes: a first transistor T1 and a second transistor T2; and the voltage control circuit 5 includes: a third transistor T3 and a fourth transistor T4; the cascading output circuit 6 includes: a fifth transistor T5, a sixth transistor T6, a first capacitor C1 and a second capacitor C2; and each scanning output circuit 7 includes: a seventh transistor T7 and an eighth transistor T8.

A control electrode of the first transistor T1 is coupled to the signal input terminal INPUT, a first electrode of the first transistor T1 is coupled to the first power supply terminal VGH1, and a second electrode of the first transistor T1 is coupled to the first node PU.

A control electrode of the second transistor T2 is coupled to the reset signal terminal RESET, a first electrode of the second transistor T2 is coupled to the first node PU, and a second electrode of the second transistor T2 is coupled to the second power supply terminal VGL1.

A control electrode and a first electrode of the third transistor T3 are coupled to the second clock signal terminal CKB, and a second electrode of the third transistor T3 is coupled to the second node PD.

A control electrode of the fourth transistor T4 is coupled to the first node PU, a first electrode of the fourth transistor T4 is coupled to the second node PD, and a second electrode of the fourth transistor T4 is coupled to the third power supply terminal VGL2.

A control electrode of the fifth transistor T5 is coupled to the first node PU, a first electrode of the fifth transistor T5 is coupled to the first clock signal terminal CK, and a second electrode of the fifth transistor T5 is coupled to the cascading signal output terminal CN.

A control electrode of the sixth transistor T6 is coupled to the second node PD, a first electrode of the sixth transistor T6 is coupled to the cascading signal output terminal CN, and a second electrode of the sixth transistor T6 is coupled to the third power supply terminal VGL2.

A first terminal of the first capacitor C1 is coupled to the first node PU, and a second terminal of the first capacitor C1 is coupled to the cascading signal output terminal CN.

A first terminal of the second capacitor C2 is coupled to the second node PD, and a second terminal of the second capacitor C2 is coupled to the third power supply terminal VGL2.

Control electrodes of seventh transistors T7_1, T7_2, and T7_3 are coupled to the first node PU, first electrodes of the seventh transistors T7_1, T7_2, and T7_3 are coupled to the corresponding scanning clock signal output terminals CK_1 to CK_3, respectively, and second electrodes of the seventh transistors T7_1, T7_2, and T7_3 are coupled to the corresponding scanning signal output terminals OUT_1 to OUT_3, respectively.

Control electrodes of eighth transistors T8_1, T8_2, and T8_3 are coupled to the second node PD, first electrodes of the eighth transistors T8_1, T8_2, and T8_3 are coupled to the corresponding scanning signal output terminals OUT_1 to OUT_3, respectively, and second electrodes of the eighth transistors T8_1, T8_2, and T8_3 are coupled to the third power supply terminal VGL2.

In some embodiments, the shift register further includes: a noise reduction circuit 8, which is coupled to the first node PU, the second node PD, and the third power supply terminal VGL2, and is configured to write the third operating voltage to the first node PU in response to a control of the voltage at the second node PD.

The noise reduction circuit 8 includes: a ninth transistor T9; a control electrode of the ninth transistor T9 is coupled to the second node PD, a first electrode of the ninth transistor T9 is coupled to the first node PU, and a second electrode of the ninth transistor T9 is coupled to the third power supply terminal VGL2.

In some embodiments, the shift register further includes: an anticreep circuit 9 which is disposed between the pre-charging reset circuit 4 and the pull-up node PU, and is configured to prevent the voltage at the pull-up node PU from being discharged through the pre-charging reset circuit 4.

The anticreep circuit 9 includes: a tenth transistor T10; a control electrode of the tenth transistor T10 is coupled to a fourth power supply terminal VGH2, a first electrode of the tenth transistor T10 is coupled to the first node PU, and a second electrode of the tenth transistor T10 is coupled to the pre-charging reset circuit 4. That is, the anticreep circuit 9 is provided between the pre-charging reset circuit 4 together with the voltage control circuit 5 and the first node PU as described above, so that the anticreep circuit 9 is connected to the pre-charging reset circuit 4 and the voltage control circuit 5 through a third node Q. At this time, when the tenth transistor T10 is turned on, the third node Q is electrically connected with the first node PU.

In the circuit structure of the shift register shown in FIG. 11 of the present disclosure, the control electrodes of the fifth transistor T5 and the seventh transistors T7_1, T7_2, and T7_3 are all connected to the first node PU; and these transistors are controlled by the voltage at the first node PU to be turned on or off. That is, when the first node PU is at an active level, the fifth transistor T5 and the seventh transistors T7_1, T7_2, and T7_3 are all turned on, and the cascading signal output terminal CN and the first to third scanning signal output terminals OUT_1 to OUT_3 output an output cascading signal as an input signal of the shift register of the next stage and scanning signals for turning on the corresponding scan lines, respectively. The control electrodes of the sixth transistor T6 and the eighth transistors T8_1, T8_2 and T8_3 are connected to the second node PD; and these transistors are controlled by the voltage at the second node PD to be turned on or off. That is, when the second node PD is at an active level, the sixth transistor T6 and the eighth transistors T8_1, T8_2 and T8_3 are all turned on, and the cascading signal output terminal CN and the first to third scanning signal output terminals OUT_1 to OUT_3 output the third voltage signal provided by the third power supply terminal and the third voltage signals for turning off the corresponding scan lines, respectively.

In addition, the transistors involved in the embodiments of the present disclosure may be independently selected from a polycrystalline silicon thin film transistor, an amorphous silicon thin film transistor, an oxide thin film transistor, and an organic thin film transistor. In the present disclosure, specifically, the "control electrode" refers to a gate electrode of the transistor, the "first electrode" refers to a source electrode of the transistor, and the "second electrode" refers to a drain electrode of the transistor. Of course, one of ordinary skill in the art will recognize that the "first electrode" and "second electrode" are interchangeable.

In addition, the transistors may be divided into N-type transistors and P-type transistors, and each transistor in the present disclosure may be independently selected from the N-type transistor and the P-type transistor. The embodiments will be exemplarily described below by taking an example in which all transistors in the pixel units are N-type transistors, which may be manufactured simultaneously by the same manufacturing process. Correspondingly, the first operating voltage is a high-level operating voltage $V_{VGH1}$, the second operating voltage is a low-level operating voltage $V_{VGL1}$, the third operating voltage is a low-level operating voltage $V_{VGL2}$, and the fourth operating voltage is a low-level operating voltage $V_{VGH2}$; where $V_{VGH1} \leq V_{VGH2} \leq 2*V_{VGH1}$, $V_{VGL2} < V_{VGL1}$.

FIG. 12 is a timing diagram illustrating operation of the shift register shown in FIG. 11. As shown in FIG. 12, an operation procedure for the shift register includes the following stages, a pre-charging stage s1, an output stage s2, and a reset stage s3.

In the pre-charging stage s1, an input signal provided by the signal input terminal INPUT is at a high level, a reset signal provided by the reset signal terminal RESET is at a low level, a clock signal provided by the first clock signal terminal CK is at a low level, and a clock signal provided by the second clock signal terminal CKB is at a high level.

The first transistor T1 is turned on; the first operating voltage $V_{VGH1}$ is written into the third node Q through the first transistor T1; a voltage at the third node Q is at a high level, the fourth transistor T4 is turned on; the third operating voltage $V_{VGL2}$ is written into the second node PD through the fourth transistor T4; and a voltage at the second node PD is at a low level. Since $V_{VGH2} > V_{VGH1}$, the tenth transistor T10 is also turned on, and a voltage at the first node PU is also at a high level.

Since the first node PU is at the high level and the second node PD is at the low level, the fifth transistor T5, the seventh transistors T7_1, T7_2, and T7_3 are all turned on, and the sixth transistor T6 and the eighth transistors T8_1, T8_2, and T8_3 are all turned off.

Since the clock signal provided by the first clock signal terminal CK is at a low level, the cascading signal output terminal CN outputs a low-level signal. Since the scanning clock signals provided by the first scanning clock signal terminal CK_1, the second scanning clock signal terminal CK_2 and the third scanning clock signal terminal CK_3 are all at a low level, the first scanning signal output terminal OUT_1, the second scanning signal output terminal OUT_2 and the third scanning signal output terminal OUT_3 output low-level signals.

In the output stage s2, the input signal provided by the signal input terminal INPUT is at a low level, the reset signal provided by the reset signal terminal RESET is at a low level, the clock signal provided by the first clock signal terminal CK is at a high level, and the clock signal provided by the second clock signal terminal CKB is at a low level.

Since the clock signal provided by the first clock signal terminal CK is switched from a low level to a high level, under a bootstrap action of the first capacitor C1, the voltage at the first node PU is pulled up to a higher level, which is approximately $2V_{VGH1}$. In this way, the tenth transistor T10 is turned off, so that the voltage at the first node PU may be effectively prevented from being discharged through the first transistor T1 and the second transistor T2 in the pre-charging reset circuit 4.

The fifth transistor T5 is maintained to be turned on, the sixth transistor T6 is maintained to be turned off. The cascading signal output terminal CN outputs a high-level signal since the clock signal provided by the first clock signal terminal CK is at a high level. The seventh transistors T7_1, T7_2, and T7_3 are maintained to be turned on and the eighth transistors T8_1, T8_2, and T8_3 are maintained to be turned off, so that if the scanning clock signal provided by the first scanning clock signal terminal CK_1 is at a high level and the scanning clock signals provided by the second scanning clock signal terminal CK_2 and the third scanning clock signal terminal CK_3 are at a low level, the first scanning signal output terminal OUT_1 outputs a high-level signal, and the second scanning signal output terminal OUT_2 and the third scanning signal output terminal OUT_3 output low-level signals.

It should be noted that in practical applications, timings of the first scanning clock signal terminal CK_1, the second scanning clock signal terminal CK_2, and the third scanning clock signal terminal CK_3 may be designed according to actual needs, respectively.

In the reset stage s3, the input signal provided by the signal input terminal INPUT is at a low level, the reset signal provided by the reset signal terminal RESET is at a high level, the clock signal provided by the first clock signal terminal CK is at a low level, and the clock signal provided by the second clock signal terminal CKB is at a high level.

The second transistor T2 is turned on; the second operating voltage $V_{VGL1}$ is written into the third node Q through the second transistor T2; the voltage at the third node Q is at a low level; and the fourth transistor T4 is turned off. The high-level signal provided by the second clock signal terminal CKB is written to the second node PD through the third transistor T3 and the voltage at the second node PD is at a high level.

Since the tenth transistor T10 is turned on, the voltage at the first node PU is also at a low level.

Since the first node PU is at a low level and the second node PD is at a high level, the third operating voltage $V_{VGL2}$ is written to the cascading signal output terminal CN through the sixth transistor T6 and written to the first scanning signal output terminal OUT_1, the second scanning signal output terminal OUT_2 and the third scanning signal output terminal OUT_3 through the eighth transistors T8_1, T8_2, and T8_3, and the cascading signal output terminal CN, the first scanning signal output terminal OUT_1, the second scanning signal output terminal OUT_2 and the third scanning signal output terminal OUT_3 all output low-level signals.

Before a next pre-charging stage, since the voltage at the second node PD is always at a high level, the ninth transistor T9 is maintained to be turned on, and the third operating voltage $V_{VGL2}$ is written into the third node Q and the first node PU through the ninth transistor T9, so that the voltages at the third node Q and the first node PU are always at a low level, thereby achieving the noise reduction.

It should be noted that, in the embodiment of the present disclosure, the ninth transistor T9 is used for the noise reduction, the tenth transistor T10 is used for preventing the voltage at the first node PU from dropping due to leakage current. In a preferable solution in the present disclosure, the ninth transistor T9 and the tenth transistor T10 are provided, but they are not necessary in the shift register.

In addition, the circuit structure of the shift register shown in FIG. 11 is merely an example. Other circuit structures may be adopted for the shift register in the present disclosure, which is not illustrated here.

An embodiment of the present disclosure also provides a display panel, which includes the display substrate provided by the above embodiment. The display panel provided by the embodiment of the present disclosure may be a liquid crystal display panel, an organic light emitting diode display panel, a light emitting diode display panel, or the like.

An embodiment of the present disclosure also provides a display apparatus, which includes the display panel provided by the above embodiment.

The display apparatus provided by the embodiment of the present disclosure may be any product or component with a display function, such as electronic paper, an LED panel, a mobile phone, a tablet computer, a television, a display, a notebook computer, a digital photo frame, and a navigator.

An embodiment of the present disclosure further provides a display driving method, as shown in FIG. 13, the display driving method is used for driving the display substrate provided in the above embodiment. For the description of the display substrate, reference may be made to the above embodiment, and details are not repeated here. In the display substrate, each shift register includes N scanning signal output terminals, N≥2 and N is an integer, and one frame time is divided into N driving stages. The display driving method includes the following steps.

The respective driving stages are sequentially performed; in an $i^{th}$ driving stage in one frame time, cascading signal output terminals of shift registers in respective stages in the gate driving circuit sequentially output cascading signals; for any one of the shift registers, when it outputs the cascading signal, the $i^{th}$ scanning signal output terminal OUT_i of the shift register outputs a scanning signal, 1≤i≤N, and i is an integer.

In some embodiments, when a monochrome picture is displayed, the data voltage loaded in each data line in any one driving stage is kept unchanged.

For the specific description of the display driving procedure, reference may be made to the above embodiments, and details are not repeated here.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A display substrate, comprising: a display region and a peripheral region at a periphery of the display region, wherein
    a plurality of gate lines extending in a row direction, a plurality of data lines extending in a column direction and a pixel array are arranged in the display region, the pixel array is in a pixel region defined by the plurality of gate lines and the plurality of data lines; the pixel array comprises a plurality of pixel units, each of which is coupled to a corresponding one of the plurality of gate lines and a corresponding one of the plurality of data lines;
    the pixel array comprises a plurality of color mixing pixel columns, each of which comprises multiple ones, emitting light of different colors, of the plurality of pixel units and arranged in periodic structures along the column direction; each of the periodic structures comprises pixel units of at least two different colors; and the number of the pixel units in each of the periodic structures in each of the plurality of color mixing pixel columns is identical; and
    a gate driving circuit is arranged in the peripheral region and comprises a plurality of cascaded shift registers, each of which is provided with a cascading signal output terminal and a plurality of scanning signal output terminals, each of which is coupled to a corresponding one of the plurality of gate lines; the cascading signal output terminal of the shift register in a stage other than a last stage is coupled to a signal input terminal of the shift register in a next stage adjacent to the stage; and the number of the scanning signal output terminals of each of the plurality of shift registers is equal to the number of the pixel units in each periodic structure in each color mixing pixel column,
    wherein each of the plurality of shift registers comprises:
        a pre-charging reset circuit, a voltage control circuit, a cascading output circuit and a plurality of scanning output circuits, wherein the plurality of scanning output circuits correspond to the plurality of scanning signal output terminals one by one; the pre-charging reset circuit, the voltage control circuit, the cascading output circuit and the plurality of scanning output circuits are coupled to a first node; and the voltage control circuit, the cascading output circuit and the plurality of scanning output circuits are coupled to a second node;
        the pre-charging reset circuit is coupled to the signal input terminal, a reset signal terminal, a first power supply terminal, and a second power supply terminal, and is configured to write a first operating voltage provided by the first power supply terminal to the first node in response to a control of a signal provided by the signal input terminal, and write a second operating voltage provided by the second power supply terminal to the first node in response to a control of a signal provided by the reset signal terminal;
        the voltage control circuit is coupled to a third power supply terminal and a second clock signal terminal, and is configured to write a third operating voltage provided by the third power supply terminal to the second node in response to a control of a voltage at the first node, or to write a second clock signal provided by the second clock signal terminal to the second node in response to a control of the second clock signal;
        the cascading output circuit is coupled to a first clock signal terminal, the third power supply terminal, and the cascading signal output terminal, and is configured to write a first clock signal provided by the first clock signal terminal to the cascading signal output terminal in response to a control of a voltage at the first node, and write the third operating voltage to the cascading signal output terminal in response to a control of a voltage at the second node; and
        each of the plurality of scanning output circuits is coupled to a corresponding scanning clock signal terminal, the third power supply terminal, and a corresponding scanning signal output terminal, and is configured to write a scanning clock signal provided by the corresponding scanning clock signal terminal to the corresponding scanning signal output terminal in response to a control of the voltage at the first node, and to write the third operating voltage to the corresponding scanning signal output terminal in response to a control of the voltage at the second node.

2. The display substrate of claim 1, wherein in the pixel array,
    the pixel units in each of the periodic structures in each of the plurality of color mixing pixel columns have same types and same arrangements; or
    the pixel units in each of the periodic structures in different color mixing pixel columns of the plurality of color mixing pixel columns have same types but have different arrangements; or
    the pixel units in each of the periodic structures in different color mixing pixel columns of the plurality of color mixing pixel columns have different types and different arrangements.

3. The display substrate of claim 1, wherein in the pixel array,
    the plurality of color mixing pixel columns comprise a plurality of color mixing pixel columns identical to each other; and
    each of the periodic structures of each of the plurality of color mixing pixel columns comprises a red pixel unit, a green pixel unit, and a blue pixel unit.

4. The display substrate of claim 1, wherein in the pixel array,
    the plurality of color mixing pixel columns comprise a plurality of first color mixing pixel columns and a plurality of second color mixing pixel columns; and the plurality of first color mixing pixel columns and the plurality of second color mixing pixel columns are alternately arranged along the row direction.

5. The display substrate of claim 4, wherein
each of the plurality of first color mixing pixel columns comprises a plurality of first periodic structures as the periodic structures, and each of the plurality of second color mixing pixel columns comprises a plurality of second periodic structures as the periodic structures;
each of the plurality of first periodic structures comprises a first periodic sub-structure and a second periodic sub-structure, and each of the plurality of second periodic structures comprises a first periodic sub-structure and a second periodic sub-structure; and
each of the plurality of first color mixing pixel columns comprises a plurality of first periodic sub-structures and a plurality of second periodic sub-structures alternately arranged in the column direction, and each of the plurality of second color mixing pixel columns comprises a plurality of second periodic sub-structures and a plurality of first periodic sub-structures alternately arranged in the column direction.

6. The display substrate of claim 5, wherein
each of the plurality of first periodic sub-structures comprises a red pixel unit and a green pixel unit arranged along the column direction, and each of the plurality of second periodic sub-structures comprises a blue pixel unit and a white pixel unit arranged along the column direction, or
each of the plurality of first periodic sub-structures comprises a red pixel unit, a green pixel unit, and a white pixel unit arranged along the column direction, and each of the plurality of second periodic sub-structures comprises a red pixel unit, a green pixel unit, and a blue pixel unit arranged along the column direction.

7. The display substrate of claim 1, wherein in the pixel array,
the plurality of color mixing pixel columns comprise a plurality of first color mixing pixel columns, a plurality of second color mixing pixel columns, a plurality of third color mixing pixel columns, and a plurality of fourth color mixing pixel columns; and
one of the plurality of first color mixing pixel columns, one of the plurality of second color mixing pixel columns, one of the plurality of third color mixing pixel columns, and one of the plurality of fourth color mixing pixel columns are arranged in sequence along the row direction to form one color mixing pixel column period; the plurality of first color mixing pixel columns, the plurality of second color mixing pixel columns, the plurality of third color mixing pixel columns, and the plurality of fourth color mixing pixel columns form a plurality of color mixing pixel column periods arranged in sequence along the row direction.

8. The display substrate of claim 7, wherein
the first color mixing pixel column comprises a plurality of first periodic structures as the periodic structures, each of which comprises a red pixel unit and a blue pixel unit arranged in the column direction;
the second color mixing pixel column comprises a plurality of second periodic structures as the periodic structures, each of which comprises a green pixel unit and a white pixel unit arranged in the column direction;
the third color mixing pixel column comprises a plurality of third periodic structures as the periodic structures, each of which comprises a blue pixel unit and a red pixel unit arranged in the column direction; and the fourth color mixing pixel column comprises a plurality of fourth periodic structures as the periodic structures, each of which comprises a white pixel unit and a green pixel unit arranged in the column direction.

9. The display substrate of claim 1, wherein
the pixel array further comprises a plurality of monochrome pixel columns, each of which comprises pixel units emitting light of a same color.

10. The display substrate of claim 9, wherein
the plurality of monochrome pixel columns and the plurality of color mixing pixel columns are alternately arranged in the row direction.

11. The display substrate of claim 10, wherein
the plurality of monochrome pixel columns comprise a plurality of first monochrome pixel columns and a plurality of second monochrome pixel columns;
the plurality of color mixing pixel columns comprise a plurality of first color mixing pixel columns and a plurality of second color mixing pixel columns alternately arranged along the row direction; and
one of the plurality of first monochrome pixel columns and one of the plurality of second monochrome pixel columns are arranged between every two adjacent first and second color mixing pixel columns.

12. The display substrate of claim 11, wherein
each of the plurality of first monochrome pixel columns comprises a plurality of red pixel units arranged in the column direction,
each of the plurality of second monochrome pixel columns comprises a plurality of green pixel units arranged in the column direction,
each periodic structure of each of the plurality of first color mixing pixel columns comprises a blue pixel unit and a white pixel unit arranged along the column direction; and
each periodic structure of each of the plurality of second color mixing pixel columns comprises a white pixel unit and a blue pixel unit arranged in the column direction.

13. The display substrate of claim 1, wherein
the pre-charging reset circuit comprises: a first transistor and a second transistor, the voltage control circuit comprises: a third transistor and a fourth transistor, the cascading output circuit comprises: a fifth transistor, a sixth transistor, a first capacitor and a second capacitor, and each of the plurality of scanning output circuits comprises: a seventh transistor and an eighth transistor;
a control electrode of the first transistor is coupled to the signal input terminal, a first electrode of the first transistor is coupled to the first power supply terminal, and a second electrode of the first transistor is coupled to the first node; and
a control electrode of the second transistor is coupled to the reset signal terminal, a first electrode of the second transistor is coupled to the first node, and a second electrode of the second transistor is coupled to the second power supply terminal;
a control electrode and a first electrode of the third transistor are coupled to the second clock signal terminal, and a second electrode of the third transistor is coupled to the second node;
a control electrode of the fourth transistor is coupled to the first node, a first electrode of the fourth transistor is coupled to the second node, and a second electrode of the fourth transistor is coupled to the third power supply terminal;

a control electrode of the fifth transistor is coupled to the first node, a first electrode of the fifth transistor is coupled to the first clock signal terminal, and a second electrode of the fifth transistor is coupled to the cascading signal output terminal;

a control electrode of the sixth transistor is coupled to the second node, a first electrode of the sixth transistor is coupled to the cascading signal output terminal, and a second electrode of the sixth transistor is coupled to the third power supply terminal;

a first terminal of the first capacitor is coupled to the first node, and a second terminal of the first capacitor is coupled to the cascading signal output terminal;

a first terminal of the second capacitor is coupled to the second node, and a second terminal of the second capacitor is coupled to the third power supply terminal;

a control electrode of the seventh transistor is coupled to the first node, a first electrode of the seventh transistor is coupled to a corresponding scanning clock signal output terminal, and a second electrode of the seventh transistor is coupled to a corresponding scanning signal output terminal; and a control electrode of the eighth transistor is coupled to the second node, a first electrode of the eighth transistor is coupled to a corresponding scanning clock signal output terminal, and a second electrode of the eighth transistor is coupled to the third power supply terminal.

14. The display substrate of claim 1, wherein each of the plurality of shift registers further comprises: a noise reduction circuit coupled to the first node, the second node, and the third power supply terminal, and configured to write the third operating voltage to the first node in response to a control of the voltage at the second node;

the noise reduction circuit comprises: a ninth transistor having a control electrode coupled to the second node, a first electrode coupled to the first node, and a second electrode coupled to the third power supply terminal;

the shift register further comprises: an anticreep circuit between the pre-charging reset circuit and the first node, and configured to prevent a voltage at the first node from being discharged through the pre-charging reset circuit; and the anticreep circuit comprises: a tenth transistor having a control electrode coupled to a fourth power supply electrode, a first electrode coupled to the first node, and a second electrode coupled to the pre-charging reset circuit.

15. A display panel, comprising: the display substrate of claim 1.

16. A display apparatus, comprising: the display panel of claim 15.

17. A display driving method for driving the display substrate of claim 1, wherein each of the plurality of shift registers comprises N scanning signal output terminals, N is an integer greater than or equal to 2, and one frame time is divided into N driving stages, the display driving method comprises:

in an $i^{th}$ driving stage in one frame time, cascading signal output terminals of shift registers in respective stages in the gate driving circuit sequentially output cascading signals; for any one of the plurality of shift registers, during it outputs the cascading signal, an $i^{th}$ scanning signal output terminal of the shift register outputs a scanning signal, $1 \leq i \leq N$, and i is an integer.

18. The display driving method of claim 17, wherein a data voltage loaded in each of the plurality of data lines in any one of the N driving stages is kept unchanged.

19. The display panel of claim 15, wherein in the pixel array, the pixel units in each of the periodic structures in each of the plurality of color mixing pixel columns have same types and same arrangements; or the pixel units in each of the periodic structures in different color mixing pixel columns of the plurality of color mixing pixel columns have same types but have different arrangements; or the pixel units in each of the periodic structures in different color mixing pixel columns of the plurality of color mixing pixel columns have different types and different arrangements.

20. The display substrate of claim 13, wherein each of the plurality of shift registers further comprises: a noise reduction circuit coupled to the first node, the second node, and the third power supply terminal, and configured to write the third operating voltage to the first node in response to a control of the voltage at the second node;

the noise reduction circuit comprises: a ninth transistor having a control electrode coupled to the second node, a first electrode coupled to the first node, and a second electrode coupled to the third power supply terminal;

the shift register further comprises: an anticreep circuit between the pre-charging reset circuit and the first node, and configured to prevent a voltage at the first node from being discharged through the pre-charging reset circuit; and the anticreep circuit comprises: a tenth transistor having a control electrode coupled to a fourth power supply electrode, a first electrode coupled to the first node, and a second electrode coupled to the pre-charging reset circuit.

* * * * *